(12) United States Patent
Jeong et al.

(10) Patent No.: US 11,450,726 B2
(45) Date of Patent: Sep. 20, 2022

(54) DISPLAY APPARATUS HAVING IMPROVED LIGHT TRANSMISSIVITY AND METHOD OF MANUFACTURING THE DISPLAY

(71) Applicant: Samsung Display Co., Ltd., Yongin-si (KR)

(72) Inventors: Sehoon Jeong, Yongin-si (KR); Jaesik Kim, Yongin-si (KR); Jaeik Kim, Yongin-si (KR); Yeonhwa Lee, Yongin-si (KR); Joongu Lee, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 75 days.

(21) Appl. No.: 16/866,112

(22) Filed: May 4, 2020

(65) Prior Publication Data

US 2020/0395430 A1    Dec. 17, 2020

(30) Foreign Application Priority Data

Jun. 14, 2019 (KR) .......................... 10-2019-0071065

(51) Int. Cl.
*H01L 29/08* (2006.01)
*H01L 27/32* (2006.01)
*H01L 51/56* (2006.01)

(52) U.S. Cl.
CPC ...... *H01L 27/3276* (2013.01); *H01L 27/3246* (2013.01); *H01L 27/3262* (2013.01); *H01L 27/3265* (2013.01); *H01L 51/56* (2013.01); *H01L 2251/308* (2013.01)

(58) Field of Classification Search
CPC .................... H01L 27/3276; H01L 27/3262
See application file for complete search history.

(56) References Cited

U.S. PATENT DOCUMENTS

| | | | |
|---|---|---|---|
| 7,262,128 B2 | 8/2007 | Yudasaka et al. | |
| 9,496,322 B1 * | 11/2016 | Zou | H01L 27/3262 |
| 9,614,018 B2 * | 4/2017 | Shi | H01L 27/1259 |
| 9,991,240 B2 * | 6/2018 | Jeong | H01L 25/0753 |
| 10,062,736 B2 * | 8/2018 | Maeda | H01L 51/5271 |
| 10,236,328 B2 | 3/2019 | Kim et al. | |
| 10,403,699 B2 | 9/2019 | Chung et al. | |

(Continued)

FOREIGN PATENT DOCUMENTS

| | | |
|---|---|---|
| KR | 10-0650535 | 11/2006 |
| KR | 10-2014-0117374 | 10/2014 |

(Continued)

*Primary Examiner* — Caleb E Henry
(74) *Attorney, Agent, or Firm* — H.C. Park & Associates, PLC

(57) ABSTRACT

According to an aspect of the invention, a display apparatus includes: a substrate comprising a first area and a second area; a first pixel electrode in the first area and a second pixel electrode in the second area; a first intermediate layer disposed on the first pixel electrode and a second intermediate layer disposed on the second pixel electrode; a first opposite electrode facing the first pixel electrode with the first intermediate layer therebetween and having a first light transmissivity; and a second opposite electrode facing the second pixel electrode with the second intermediate layer therebetween and having a second light transmissivity lower than the first light transmissivity.

13 Claims, 21 Drawing Sheets

(56) References Cited

U.S. PATENT DOCUMENTS

| | | | |
|---|---|---|---|
| 2014/0338728 A1 | 11/2014 | Cheyns | |
| 2015/0318334 A1* | 11/2015 | Kim | H01L 27/3213 |
| | | | 257/40 |
| 2019/0198816 A1* | 6/2019 | Park | G02B 27/0176 |

FOREIGN PATENT DOCUMENTS

| | | |
|---|---|---|
| KR | 10-2017-0129318 | 11/2017 |
| KR | 10-2018-0108948 | 10/2018 |

* cited by examiner

DISPLAY APPARATUS HAVING IMPROVED LIGHT TRANSMISSIVITY AND METHOD OF MANUFACTURING THE DISPLAY

CROSS REFERENCE TO RELATED APPLICATION

This application claims priority from and the benefit of Korean Patent Application No. 10-2019-0071065, filed on Jun. 14, 2019, which is hereby incorporated by reference for all purposes as if fully set forth herein.

BACKGROUND

Field

Exemplary implementations of the invention relate generally to a display apparatus and a method of manufacturing the display apparatus, and more particularly, to a display apparatus with improved light transmissivity and a method of manufacturing the display apparatus.

Discussion of the Background

Display apparatuses, particularly organic light-emitting display apparatuses, have attracted attention as next-generation display apparatuses due to their strengths such as wide viewing angles, excellent contrast, and high response speeds.

Generally, an organic light-emitting display apparatus includes a thin-film transistor and organic light-emitting diode formed on a substrate, and is driven as the organic light-emitting diodes independently emit light. Organic light-emitting display apparatuses are used as display units of small-sized products such as cell phones or display units of large-sized products such as televisions.

An organic light-emitting display apparatus includes an organic light-emitting diode which includes a pixel electrode, an opposite electrode, and an organic emission layer between the pixel electrode and the opposite electrode. The pixel electrode and the opposite electrode of the organic light-emitting diode may be formed by various methods, for example, a deposition process using a metal mask or an inkjet method.

The above information disclosed in this Background section is only for understanding of the background of the inventive concepts, and, therefore, it may contain information that does not constitute prior art.

SUMMARY

Applicant realized that, when an opposite electrode in a display apparatus is formed by using a metal mask, an opposite electrode having a uniform thickness may be formed on a front surface of a panel, but the opposite electrode may not be properly formed in a portion of a display area, thereby impeding the ability to realize a full screen display.

Display apparatuses constructed according to the principles and exemplary implementations of the invention and methods of manufacturing the same are capable of selectively forming an opposite electrode in a portion of a panel to enhance light transmissivity. For example, the opposite electrode may form a transmission window and/or use a liquid repelling layer to create an area with greater light transmissivity.

Additional features of the inventive concepts will be set forth in the description which follows, and in part will be apparent from the description, or may be learned by practice of the inventive concepts.

According to an aspect of the invention, a display apparatus includes: a substrate having a first area and a second area; a first pixel electrode in the first area and a second pixel electrode in the second area; a first intermediate layer disposed on the first pixel electrode and a second intermediate layer disposed on the second pixel electrode; a first opposite electrode facing the first pixel electrode with the first intermediate layer therebetween and having a first light transmissivity; and a second opposite electrode facing the second pixel electrode with the second intermediate layer therebetween and having a second light transmissivity lower than the first light transmissivity.

The first opposite electrode may include a transmissive conductive material.

The transmissive conductive material may include at least one material selected from the group consisting of indium tin oxide, indium zinc oxide, zinc oxide, indium oxide, indium gallium oxide, and aluminum zinc oxide.

The second opposite electrode may include a reflective conductive material.

The first pixel electrode can have a transmissive conductive material, and light transmissivity of the first pixel electrode is greater than light transmissivity of the second pixel electrode.

The second opposite electrode can be disposed only in the second area.

The first opposite electrode may be disposed on the first area and the second area and can be in contact with at least a portion of the second opposite electrode.

At least a portion of the first opposite electrode may be disposed on the second opposite electrode.

A third opposite electrode can be disposed between the first intermediate layer and the first opposite electrode and between the second intermediate layer and the second opposite electrode.

The third opposite electrode may include a material the same as the material of the first opposite electrode.

The first opposite electrode and the second opposite electrode can be directly disposed on the third opposite electrode.

A light transmission window in the first area.

A liquid-repelling layer may be disposed between the first intermediate layer and the first opposite electrode.

The liquid-repelling layer may include a liquid-repelling material having a surface energy of no more than about 20 mJ/m$^2$.

The liquid-repelling material may include at least one of a fluoro material, a perfluoro material, and a self-assembled monolayer.

According to another aspect of the invention, a method of manufacturing a display apparatus includes: preparing a substrate having a first area and a second area; forming a first pixel electrode in the first area and a second pixel electrode in the second area; forming a first intermediate layer on the first pixel electrode and a second intermediate layer on the second pixel electrode; forming, on the first intermediate layer, a liquid-repelling layer including a liquid-repelling material; forming a second opposite electrode on the second layer, the second opposite electrode facing the second pixel electrode with the second intermediate layer therebetween and having a second light transmissivity; and forming a first opposite electrode on the liquid-repelling layer, the first opposite electrode facing the first pixel electrode with the first layer intermediate therebetween and having a first light transmissivity higher than the second light transmissivity.

The first opposite electrode may include a transmissive conductive material.

The second opposite electrode can include a reflective conductive material.

A third opposite electrode may be formed on the first intermediate layer and the second intermediate layer before the forming of the liquid-repelling layer.

The liquid-repelling material may include a liquid-repelling material having a surface energy of no more than about 20 mJ/m².

It is to be understood that both the foregoing general description and the following detailed description are exemplary and explanatory and are intended to provide further explanation of the invention as claimed.

BRIEF DESCRIPTION OF THE DRAWINGS

The above and other aspects, features, and advantages of certain embodiments will be more apparent from the following description taken in conjunction with the accompanying drawings, in which.

DETAILED DESCRIPTION

Figure 1:
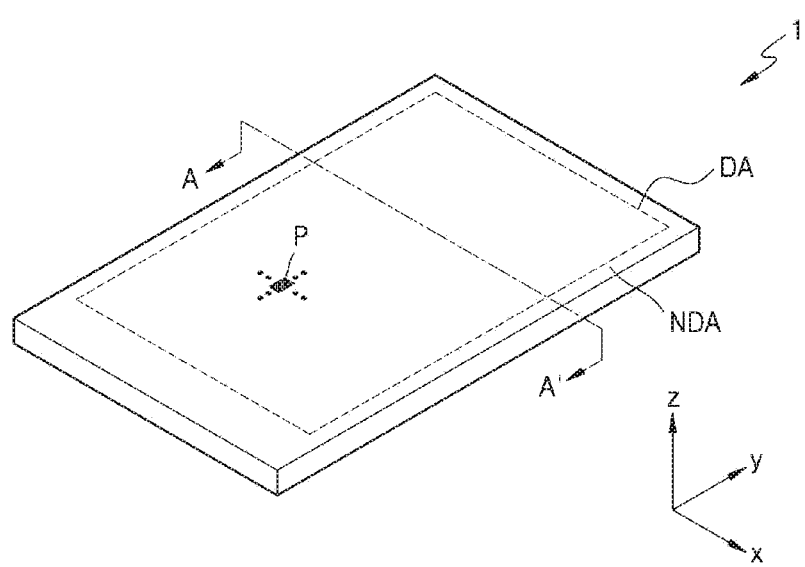
FIG. 1 is a perspective view of an exemplary embodiment of a display apparatus constructed according to principles of the invention.

In the following description, for the purposes of explanation, numerous specific details are set forth in order to provide a thorough understanding of various exemplary embodiments or implementations of the invention. As used herein "embodiments" and "implementations" are interchangeable words that are non-limiting examples of devices or methods employing one or more of the inventive concepts disclosed herein. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments. Further, various exemplary embodiments may be different, but do not have to be exclusive. For example, specific shapes, configurations, and characteristics of an exemplary embodiment may be used or implemented in another exemplary embodiment without departing from the inventive concepts.

Unless otherwise specified, the illustrated exemplary embodiments are to be understood as providing exemplary features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "disposed on", "connected to," or "coupled to" another element or layer, it may be directly on, connected to, or coupled to the other element or layer or intervening elements or layers may be present. When, however, an element or layer is referred to as being "directly on," "directly disposed on", "directly connected to," or "directly coupled to" another element or layer, there are no intervening elements or layers present. To this end, the term "connected" may refer to physical, electrical, and/or fluid connection, with or without intervening elements. Further, the D1-axis, the D2-axis, and the D3-axis are not limited to three axes of a rectangular coordinate system, such as the x, y, and z-axes, and may be interpreted in a broader sense. For example, the D1-axis, the D2-axis, and the D3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

As used herein, the term "layer" does not connote any particular position with respect to other layers, and thus is broad enough to refer to layers that are disposed in the inner most or outermost layer in a stack, or intermediate other layers.

Various exemplary embodiments are described herein with reference to sectional and/or exploded illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

Hereinafter, an organic light emitting display apparatus is described as an example of a display apparatus according to an embodiment, but the exemplary embodiments are not limited thereto. As an embodiment, the display apparatus may include an inorganic light emitting display or a quantum dot light emitting display. For example, an emission layer of a display element provided in the exemplary embodiments may include an organic material, quantum dots, or the organic material and quantum dots.

FIG. 1 is a perspective view of an exemplary embodiment of the display apparatus 1 according to an embodiment.

Referring to FIG. 1, the display apparatus 1 includes a display area DA in which an image is displayed and a non-display area NDA in which an image is not displayed. The display apparatus 1 may generate an image by using light emitted from a plurality of pixels P arranged in the display area DA.

Although FIG. 1 shows a generally rectangular display apparatus 1, the illustrated embodiment is not limited thereto. Shapes of the display area DA may include a generally circle shape, a generally oval shape, or a generally polygonal shape, such as a generally triangle shape or a generally pentagon shape. In addition, although the display apparatus 1 of FIG. 1 is a panel display apparatus having a generally flat shape, the display apparatus 1 may be realized in various shapes such as a flexible display apparatus, a foldable display apparatus, or a rollable display apparatus.

Figure 2:
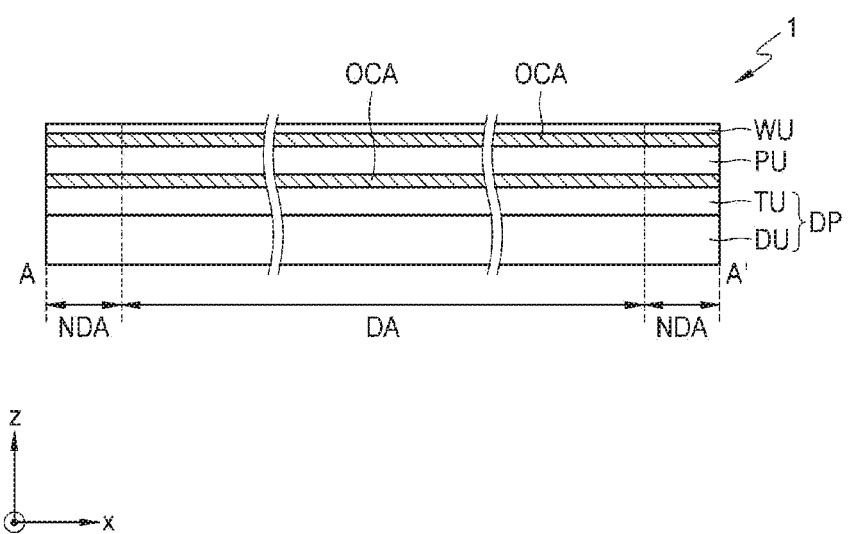
FIG. 2 is a cross-sectional view taken along line A-A' of the display apparatus shown in FIG. 1.

FIG. 2 is a cross-sectional view taken along line A-A' of the display apparatus 1 of FIG. 1. FIG. 2 is simply shown for description of the stacked relationship between functional panels and/or functional units included in the display apparatus 1.

Referring to FIG. 2, the display apparatus 1 according may include a display unit DU (that is, a display layer), a touch unit TU, a polarization unit PU, and a window unit WU. At least some of the display unit DU, the touch unit TU, the polarization unit PU, and the window unit WU may be formed in continuous processes or attached to one another by using an adhesive member. In FIG. 2, an optical clear adhesive member OCA is shown as an example of an adhesive member. The adhesive member to be described hereinafter may include a common adhesive or a tackifier. In an embodiment, the polarization unit PU and the window unit WU may be replaced with other configurations or omitted.

The touch unit TU is directly arranged on the display unit DU. As used herein, the expression "configuration B is arranged directly on configuration A" indicates that another adhesive layer/adhesive member is not arranged between configuration A and configuration B. Configuration B is formed, after configuration A is formed, in a continuous process on a base plane provided by configuration A.

The display unit DU and the touch unit TU arranged directly on the display unit DU may be collectively defined as a display panel DP. As an example, as shown in FIG. 2, the optical clear adhesive member OCA may be arranged respectively between the display panel DP and the polarization unit PU and between the polarization unit PU and the window unit WU.

The display unit DU generates an image and the touch unit TU obtains coordinate information of an external input (for example, a touch event). The display panel DP according to an embodiment may further include a protection member arranged under the display unit DU. The protection member and the display unit DU may be attached to each other by the adhesive member.

The display unit DU according to an embodiment may include an emission type display panel but is not particularly limited thereto. For example, the display unit DU may include an organic light-emitting display panel or a quantum dot light-emitting display panel, or any other known type of display panel. An emission layer of the organic light emitting display panel may include an organic light-emitting material. An emission layer of the quantum dot light-emitting display panel may include quantum dots, a quantum rod, and the like. Hereinafter, the display unit DU is described as an organic light-emitting display panel for illustrative purposes.

Figure 3:
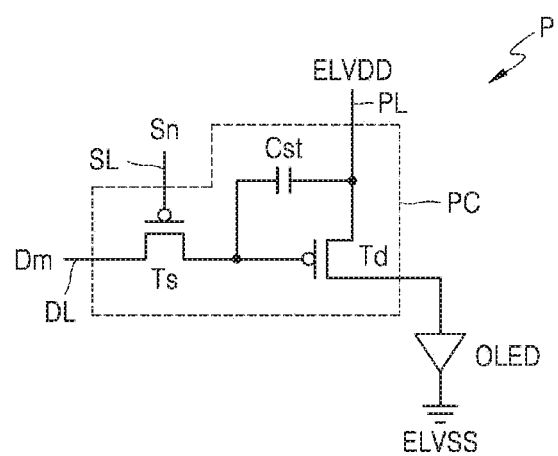
FIGS. 3 and 4 are equivalent circuit diagrams of exemplary embodiments of a representative pixel that may be included in the display apparatus of FIG. 1.
Figure 4:
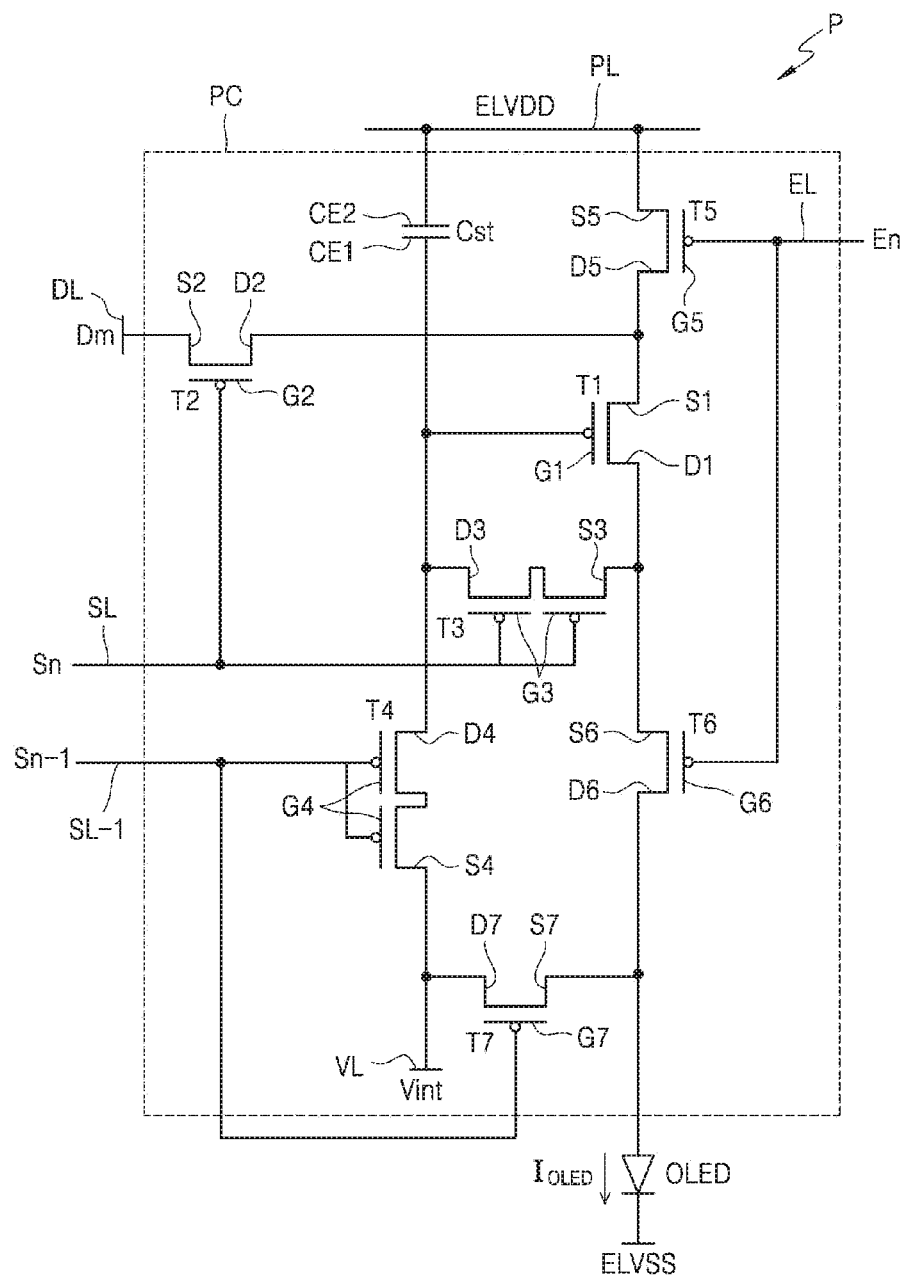

The polarization unit PU reduces a reflectance of external light incident from above the window unit WU. The polarization unit PU according to an embodiment may include a retarder and a polarizer. The retarder may be a film type or a liquid crystal coating type and may include a λ/2 retarder and/or a λ/4 retarder. The polarizer may also be a film type or a liquid crystal coating type. A film type polarizer may include a stretched type synthetic resin film, and a liquid crystal coating type polarizer may include liquid crystals arranged in a certain arrangement. The retarder and the polarizer may each further include a protection film. The retarder and the polarizer of the protection films thereof may be defined as a base layer of the polarization unit PU. FIGS. 3 and 4 are equivalent circuit diagrams of exemplary embodiments of a representative pixel that may be included in the display apparatus 1 of FIG. 1.

Referring to FIG. 3, each pixel P includes a pixel circuit PC, which is connected to a scan line SL and a data line DL, and an organic light-emitting diode OLED connected to the pixel circuit PC.

The pixel circuit PC includes a driving thin film transistor Td, a switching thin film transistor Ts, and a storage capacitor Cst. The switching thin film transistor T2, which is connected to the scan line SL and the data line DL, delivers a data signal Dm, which is input through the data line DL, to the driving thin film transistor Td in response to a scan signal Sn input through the data line DL.

The storage capacitor Cst, which is connected to the switching thin film transistor Ts and the driving voltage line PL, stores a voltage corresponding to a difference between a voltage received from the switching thin film transistor Ts and a first power voltage ELVDD (or a driving voltage) provided to the driving voltage line PL.

The driving thin film transistor Td, which is connected to the driving voltage line PL and the storage capacitor Cst, may control a driving current flowing from the driving voltage line PL to the organic light-emitting diode OLED to correspond to a value of the voltage stored in the storage capacitor Cst. The organic light-emitting diode OLED may emit light having a certain luminance in response to the driving current. The output of the OLED is connected to a second voltage ELVSS.

The pixel circuit PC including two thin film transistors and one storage capacitor is described with reference to FIG. 3, but are not limited thereto. As shown in FIG. 4, the pixel circuit PC may include seven thin film transistors and one storage capacitor. FIG. 4 shows the pixel circuit PC including one storage capacitor Cst, but the pixel circuit PC may include two or more storage capacitors.

Referring to FIG. 4, the pixel P includes the pixel circuit PC and the organic light-emitting diode OLED connected to the pixel circuit PC. The pixel circuit PC may include a plurality of thin film transistors and a storage capacitor. The thin film transistors and the storage capacitor may be connected to signal lines (e.g., the scan line SL, a previous scan line SL-1, an emission control line EL, and the data line DL), an initialization voltage line VL, and the driving voltage line PL.

FIG. 4 shows a case in which the pixel P is connected to the signal lines (e.g., the scan line SL, the previous scan line SL-1, the emission control line EL, and the data line DL), the initialization voltage line VL, and the driving voltage line PL, but the exemplary embodiments are not limited thereto. As an embodiment, at least one of the signal lines (e.g., the scan line SL, the previous scan line SL-1, the emission control line EL, and the data line DL), the initialization voltage line VL, and the driving voltage line PL may be shared by neighboring pixels.

The signal lines include: the scan line SL that delivers a scan signal Sn; the previous scan line SL-1 that delivers a previous scan signal Sn-1 to a first initialization thin film transistor T4 and a second initialization thin film transistor T7; the emission control line EL that delivers an emission control signal En to an operation control thin film transistor T6; and the data line DL that intersects with the scan line SL and delivers a data signal Dm. The driving voltage line PL delivers the driving voltage ELVDD to the driving thin film transistor T1, and the initialization voltage line VL delivers an initialization voltage Vint that initializes the driving thin film transistor and the pixel electrode.

A driving gate electrode G1 of the driving thin film transistor T1 is connected to a lower electrode CE1 of the storage capacitor Cst; a driving source electrode S1 of the driving thin film transistor T1 is connected to the driving voltage line PL via the operation control thin film transistor T5; and a driving drain electrode D1 of the driving thin film transistor T1 is electrically connected to the pixel electrode of a organic light-emitting diode OLED via the emission control thin film transistor T6. The driving thin film transistor T1 receives the data signal Dm in response to a switching operation of the switching thin film transistor T2 and supplies a driving current $I_{OLED}$ to the organic light-emitting diode OLED.

A switching gate electrode G2 of the switching thin film transistor T2 is connected to the scan line SL; a switching source electrode S2 of the switching thin film transistor T2 is connected to the data line DL; and a switching drain electrode D2 of the switching thin film transistor T2 is connected to the driving source electrode Si of the driving thin film transistor T1 and is also connected to the driving voltage line PL via the operation control thin film transistor T5. The switching thin film transistor T2 is turned on in response to the scan signal Sn, which is delivered through the scan line SL, and performs a switching operation of delivering the data signal Dm, which is delivered through the data line DL, to the driving source electrode S1 of the driving thin film transistor T1.

A compensation gate electrode G3 of a compensation thin film transistor T3 is connected to the scan line SL; a compensation source electrode S3 of the compensation thin film transistor T3 is connected to the driving drain electrode D1 of the driving thin film transistor T1 and is also connected to the pixel electrode of the organic light-emitting diode OLED; and a compensation drain electrode D3 of the compensation thin film transistor T3 is connected to the lower electrode CE1, a first initialization drain electrode D4 of the first initialization thin film transistor T4, and the driving gate electrode G1 of the driving thin film transistor T1. The compensation thin film transistor T3 is turned on in response to the scan signal Sn, which is delivered through the scan line SL, and electrically connects the driving gate electrode G1 and the driving drain electrode D1 in the driving thin film transistor T1 to each other, thereby having the driving thin film transistor T1 diode-connected.

The first initialization gate electrode G4 of the first initialization thin film transistor T4 is connected to the previous scan line SL-1; a first initialization source electrode S4 of the first initialization thin film transistor T4 is connected to a second initialization drain electrode D7 of the second initialization thin film transistor T7 and the initialization voltage line VL; and the first initialization drain electrode D4 of the first initialization thin film transistor T4 is connected to the lower electrode CE1 of the storage capacitor Cst, the compensation drain electrode D3 of the compensation thin film transistor T3, and the driving gate electrode G1 of the driving thin film transistor T1. The first initialization thin film transistor T4 is turned on in response to the previous scan signal Sn-1, which is delivered through the previous scan line SL-1, and delivers the initialization voltage Vint to the driving gate electrode G1 of the driving thin film transistor, thereby performing an initialization operation of initializing a voltage of the driving gate electrode G1 of the driving thin film transistor T1.

An operation control gate electrode G5 of the operation control thin film transistor T5 is connected to the emission control line EL; an operation control source electrode S5 of the operation thin film transistor T5 is connected to a lower driving voltage line PL; and an operation control drain electrode D5 of the operation control thin film transistor T5 is connected to the driving source electrode S1of the driving thin film transistor and the switching drain electrode D2 of the switching thin film transistor T2.

An emission control gate electrode G6 of the emission control thin film transistor T6 is connected to the emission control line EL; an emission control source electrode S6 of the emission control thin film transistor T6 is connected to the driving drain electrode D1 of the driving thin film transistor T1 and the compensation source electrode S3 of the compensation thin film transistor; and an emission control drain electrode D6 of the emission control thin film transistor T6 is connected to a second initialization source electrode S7 of the second initialization thin film transistor T7 and the pixel electrode of the organic light-emitting diode OLED.

The operation control thin film transistor T5 and the emission control thin film transistor T6 are simultaneously turned on in response to the emission control signal En that is delivered through the emission control line EL such that the driving voltage ELVDD is delivered to the organic light-emitting diode OLED and the driving current $I_{OLED}$ through the organic light-emitting diode OLED.

A second initialization gate electrode G7 of the second initialization thin film transistor T7 is connected to the previous scan line SL-1; a second initialization electrode S7 of the second initialization thin film transistor T7 is connected to the emission control drain electrode D6 of the emission control thin film transistor T6 and the pixel electrode of the organic light-emitting diode OLED; and a second initialization drain electrode D7 of the second initialization thin film transistor T7 is connected to the first initialization source electrode S4 of the first initialization thin film transistor T4 and the initialization voltage line VL. The second initialization thin film transistor T7 is turned on in response to the previous scan signal Sn-1, which is delivered through the previous scan line SL-1, and initializes the pixel electrode of the organic light-emitting diode OLED.

FIG. 4 shows a case in which the first initialization thin film transistor T4 and the second initialization thin film transistor T7 are connected to the previous scan line SL-1, but the exemplary embodiments are not limited thereto. As an embodiment, the first initialization thin film transistor T4 may be connected to the previous scan line SL-1 and driven in response to the previous scan signal Sn-1, and the second initialization thin film transistor T7 may be connected to an extra scan line (for example, a next scan line) and be driven in response to a signal that is delivered to the scan line.

An upper electrode CE2 of the storage capacitor Cst is connected to the driving voltage line PL, and an opposite electrode of the organic light-emitting diode OLED is connected to the common voltage ELVSS. Therefore, the organic light-emitting diode OLED may receive the driving current IOLED from the driving thin film transistor T1 and emit light, thereby displaying an image.

In FIG. 4, each of the compensation thin film transistor T3 and the first initialization thin film transistor T4 has dual gate electrodes, but each of the compensation thin film transistor T3 and the first initialization thin film transistor T4 may have a single gate electrode.

Figure 5:
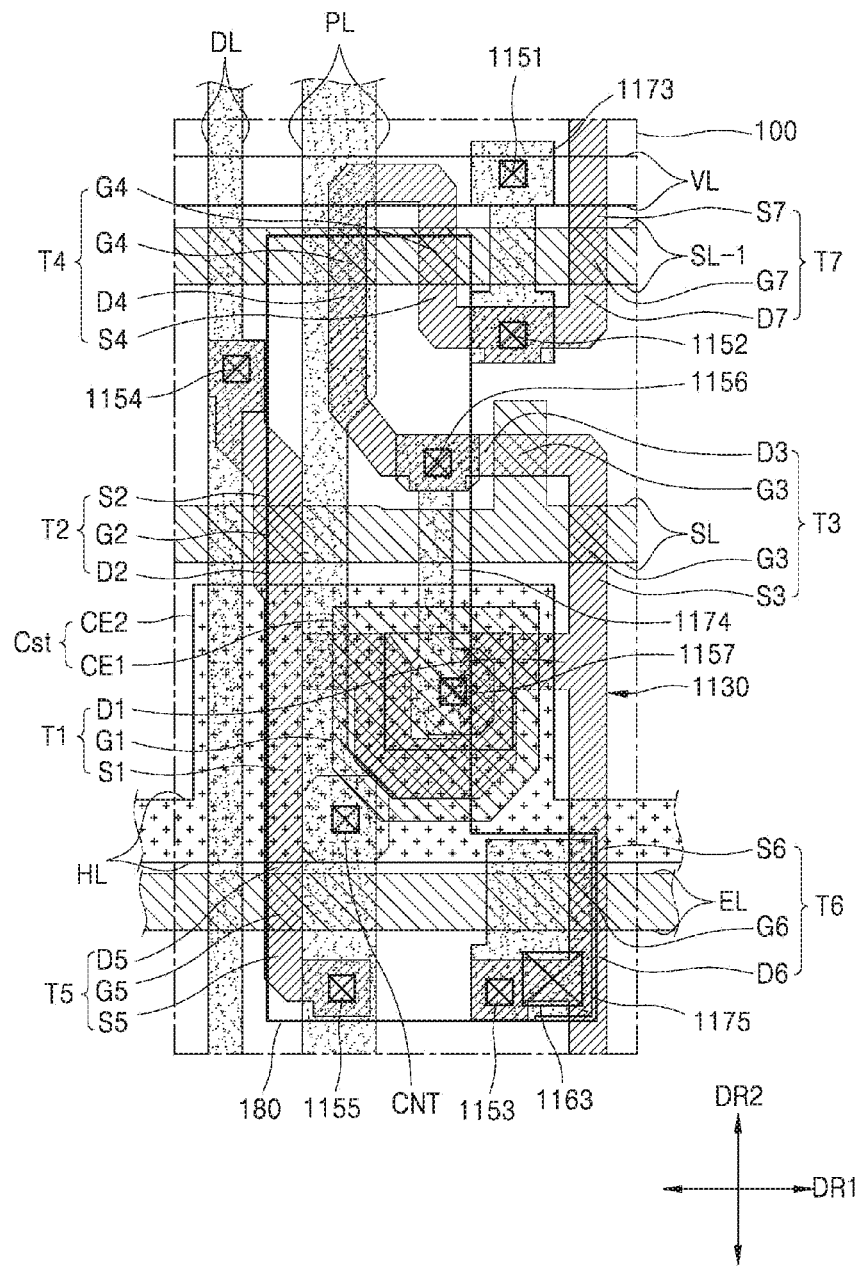
FIG. 5 is a top, plan view of an exemplary embodiment of a pixel circuit of a representative pixel.

FIG. 5 is a top, plan view of an exemplary embodiment of a pixel circuit PC of a representative pixel P.

Referring to FIG. 5, the driving thin film transistor T1, the switching thin film transistor T2, the compensation thin film transistor T3, the first initialization thin film transistor T4, the operation control thin film transistor T5, the emission control thin film transistor T6, and the second initialization thin film transistor T7 are arranged along a semiconductor layer 1130.

The semiconductor layer 1130 is arranged on the substrate 100 on which a buffer layer including an inorganic insulating material is formed. In the illustrated embodiment, the semiconductor layer 1130 may include low temperature polysilicon (LTPS). A polysilicon material has a high electron mobility (equal to or higher than about 100 cm$^2$/Vs), low energy consumption, and high reliability, and thus may be used as a semiconductor layer of a thin film transistor in a display apparatus. However, the exemplary embodiments are not limited thereto. As an embodiment, the semiconductor layer 1130 may include amorphous silicon (a-Si) and/or an oxide semiconductor, some of the semiconductor layers in the plurality of thin film transistors may include LTPS, and other semiconductor layers may include a-Si and/or oxide semiconductor.

However, the exemplary embodiments are not limited thereto. As an embodiment, the semiconductor layer 1130 may include amorphous silicon (a-Si) and/or an oxide semiconductor, and some of the semiconductor layers in the plurality of thin film transistors may include LTPS, and other semiconductor layers may include a-Si and/or oxide semiconductor. In other words, it is understood that the semiconductor layers of driving thin film transistor T1, the switching thin film transistor T2, the compensation thin film transistor T3, the first initialization thin film transistor T4, the operation control thin film transistor T5, the emission control thin film transistor T6, and the second initialization thin film transistor T7 are connected to one another and bent in various shapes.

The semiconductor layer 1130 includes a channel area, a source area and a drain area at two sides of the channel area, wherein the source area and the drain area may respectively be understood as a source electrode and a drain electrode of a relevant thin film transistor. Hereinafter, for convenience, a source area and a drain area are respectively referred to as a source electrode and a drain electrode.

The driving thin film transistor T1 includes the driving gate electrode G1, which overlaps a driving channel area, and the driving source electrode S1 and the driving drain electrode D1 at two sides of the driving channel area. The driving channel area that overlaps the driving gate electrode G1 may have a bent shape like a substantially omega shape to form a long channel length in a relatively narrow area. When the driving channel area is long, the driving range of a gate voltage broadens. Therefore, gradation of light emitted from the organic light-emitting diode OLED may be more elaborately controlled and the quality of display may be improved.

The switching thin film transistor T2 includes the switching gate electrode G2, which overlaps a switching channel area, and the switching source electrode S2 and the switching drain electrode D2 at two sides of the switching channel area. The switching drain electrode D2 may be connected to the driving source electrode S1.

The compensation thin film transistor T3, which is a dual thin film transistor, may include the compensation gate electrodes G3 that respectively overlap two compensation channel areas, and may also include the compensation source electrode S3 and the compensation drain electrode D3 arranged at two sides of the two compensation channel areas. The compensation thin film transistor T3 may be connected to the driving gate electrode G1 of the driving thin film transistor T1 through a node connection line 1174 to be described later.

The first initialization thin film transistor T4, which is a dual thin film transistor, may include the first initialization gate electrodes T4 that overlap two first initialization channel areas, and the first initialization source electrode S4 and the first initialization drain electrode D4 respectively arranged at two sides of the first initialization channel areas.

The operation control thin film transistor T5 may include the operation control gate electrode G5, which overlaps an operation control channel area, and the operation control source electrode S5 and the operation control drain electrode D5 arranged at two sides of the operation control channel area. The operation control drain electrode D5 may be connected to the driving source electrode S1.

The emission control thin film transistor T6 may include the emission control gate electrode G6, which overlaps an emission control channel area, and the emission control source electrode S6 and the emission control drain electrode D6 arranged at two sides of the emission control channel area. The emission control source electrode S6 may be connected to the driving drain electrode D1.

The second initialization thin film transistor T7 may include the second initialization gate electrode G7, which overlaps a second initialization channel area, and the second initialization source electrode S7 and the second initialization drain electrode D7 arranged at two sides of the second initialization channel area.

The thin film transistors may be connected to the signal lines (e.g., the scan line SL, the previous scan line SL-1, the emission control line EL, and the data line DL), the initialization voltage line VL, and the driving voltage line PL.

On the semiconductor layer 1130, the scan line SL, the previous scan line SL-1, the emission control line EL, and the driving gate electrode G1 may be arranged with insulating layer(s) therebetween.

The scan line SL may extend in a first direction DR1. Portions of the scan line SL may respectively correspond to the switching gate electrode G2 and the compensation gate electrode G3. For example, portions of the scan line SL that overlap the channel area of the switching thin film transistor T2 and the compensation transistor T3 may be the switching gate electrode G2 and the compensation gate electrode G3, respectively.

The previous scan line SL-1 extends in a first direction DR1 and portions of the previous scan line SL-1 may respectively correspond to the first initialization gate electrode G4 and the second initialization gate electrode G7. For example, portions of the previous scan line SL-1 that overlap the channel areas of the first initialization thin film transistor T4 and the second thin film transistor T7 may be the first initialization gate electrode G4 and the second initialization gate electrode G7, respectively.

The emission control line EL extends in the first direction DR1. Portions of the emission control line EL may respectively correspond to the operation control gate electrode G5 and the emission control gate electrode G6. For example, portions of the emission control line EL that overlap the channel areas of the operation control thin film transistor T5 and the emission control thin film transistor T6 may be the operation control gate electrode G5 and the emission control gate electrode G6, respectively.

The driving gate electrode G1 is a floating electrode and may be connected to the compensation thin film transistor T3 via the node connection line 1174.

An electrode voltage line HL may be arranged on the scan line SL, the previous scan line SL-1, the emission control line EL, and the driving gate electrode G1, with insulating layer(s) therebetween.

The electrode voltage line HL may extend in the first direction DR1 to intersect with the data line DL and the driving voltage line PL. A portion of the electrode voltage line HL may cover at least a portion of the driving gate electrode G1 and form the storage capacitor Cst together with the driving gate electrode G1. For example, the driving gate electrode G1 may be the lower electrode CE1 of the storage capacitor Cst and a portion of the electrode voltage line HL may be the upper electrode CE2 of the storage capacitor Cst.

The upper electrode CE2 of the storage capacitor Cst is electrically connected to the driving voltage line PL. In this regard, the electrode voltage line HL may be in contact with the driving voltage line PL arranged on the electrode voltage line HL via a contact hole CNT. Accordingly, a voltage level of the electrode voltage line HL (a constant voltage) may be equal to a voltage level of the driving voltage line PL. For example, the electrode voltage line HL may have a constant voltage of about +5 V. The electrode voltage line HL may be understood as a lateral driving voltage line.

The driving voltage line PL extends in the second direction, and the electrode voltage line HL that is electrically connected to the driving voltage line PL extends in the first direction that intersects with the second direction. Therefore, a plurality of driving voltage lines PL and a plurality of electrode voltage lines HL may form a mesh structure in the display area.

The data line DL, the driving voltage line PL, an initialization connection line 1173, and the node connection line 1174 may be arranged on the electrode voltage line HL, with insulating layer(s) therebetween.

The data line DL may extend in a second direction DR2 and be in contact with the switching source electrode S2 of the switching thin film transistor T2 via a contact hole 1154. A portion of the data line DL may be understood as the switching source electrode S2.

The driving voltage line PL extends in the second direction and is in contact with the electrode voltage line HL via the contact hole CNT, as described above. In addition, the driving voltage line PL may be connected to the operation control thin film transistor T5 via a contact hole 1155. The driving voltage line PL may be in contact with the operation control drain electrode D5 via the contact hole 1155.

An end of the initialization connection line 1173 may be connected to the first initialization thin film transistor T4 and the second initialization thin film transistor T7 via a contact hole 1152, and another end of the initialization connection line 1173 may be connected to the initialization voltage line VL, which will be described later, via a contact hole 1151.

An end of the node connection line 1174 may be connected to the compensation drain electrode D3 via a contact hole 1156, and another end of the node connection line 1174 may be in contact with the driving gate electrode G1 via a contact hole 1157.

The initialization voltage line VL may be arranged on the data line DL, the driving voltage line PL, the initialization connection line 1173, and the node connection line 1174, with insulating layer(s) therebetween.

The initialization voltage line VL extends in the first direction DR1. The initialization voltage line VL may be connected to the first initialization thin film transistor T4 and the second initialization thin film transistor T7 through the initialization connection line 1173. The initialization voltage line VL may have a constant voltage (for example, about −2 V and the like).

Figure 7:
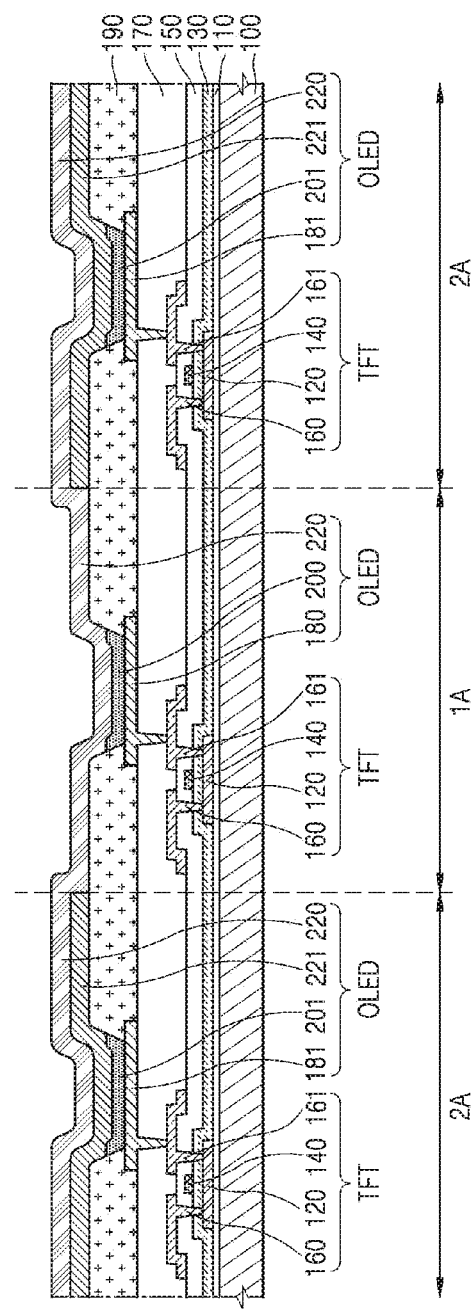
FIG. 7 is a cross-sectional view of an exemplary embodiment of the display apparatus constructed according to principles of the invention.

The initialization voltage line VL may be arranged on the same layer and include the same material as the first pixel electrode 180 of the organic light-emitting diode OLED (see FIG. 7). The first pixel electrode 180 may be connected to the emission control thin film transistor T6. The first pixel electrode 180 may be in contact with a contact metal 1175 via a contact hole 1163, and the contact metal 1175 may be in contact with the emission control drain electrode D6 via the contact hole 1153.

In FIG. 5, the initialization voltage line VL is arranged on the same layer as that of the first pixel electrode 180. However, in an embodiment, the initialization voltage line VL may be arranged on the same layer as the electrode voltage line HL.

Figure 6:
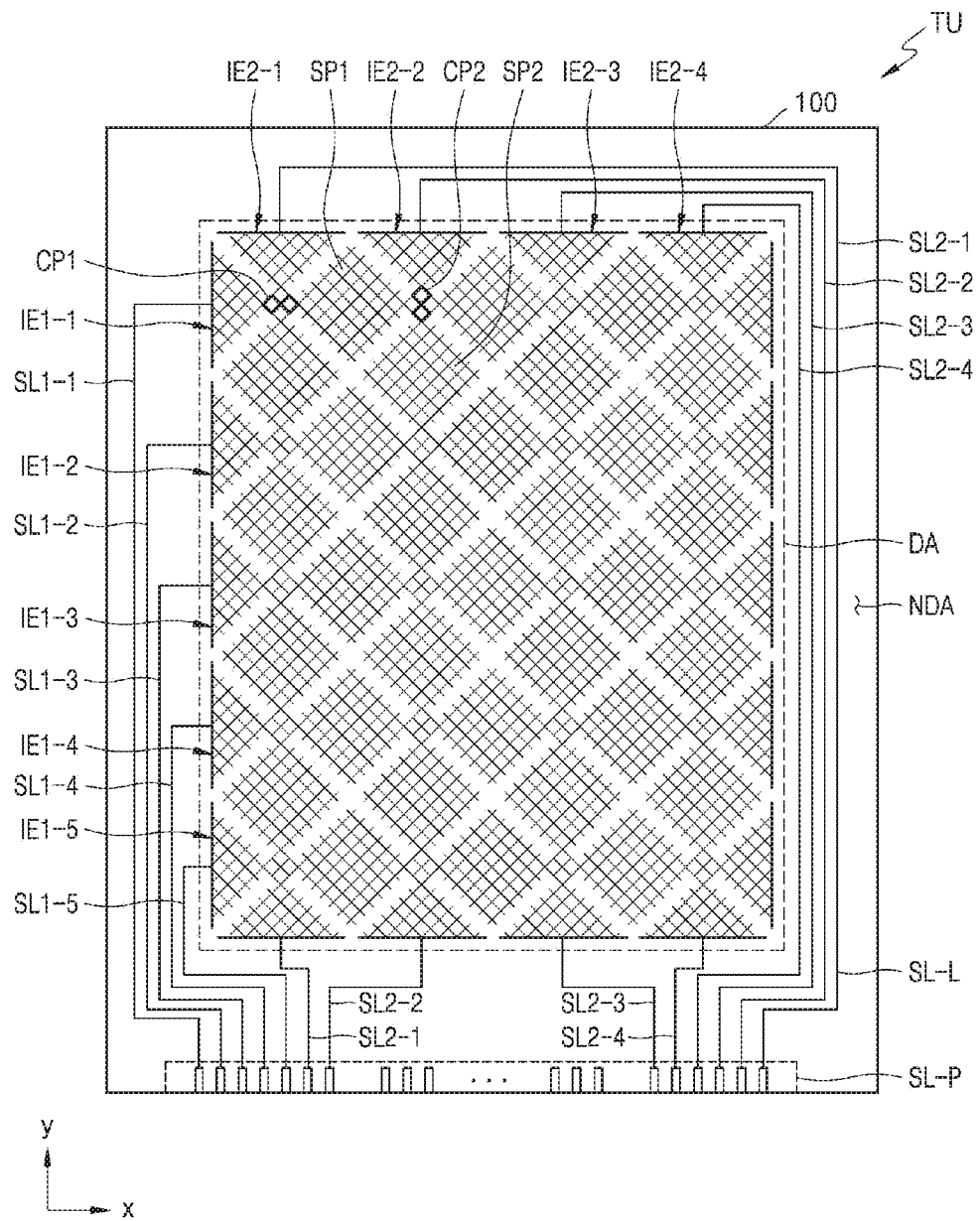
FIG. 6 is a top, plan view of an exemplary embodiment of a touch unit of the display apparatus.

FIG. 6 is a top, plan view of an exemplary embodiment of a touch unit TU of the display apparatus.

Referring to FIG. 6, the touch unit TU may include first sensing electrodes IE1-1 through IE1-5, first signal lines SL1-1 through SL1-5 connected to the first sensing electrodes IE1-1 through IE1-5, second sensing electrodes IE2-1 through IE2-4, and second signal lines SL2-1 through SL2-4 connected to the second sensing electrodes IE2-1 through IE2-4. The touch unit TU is disposed on a substrate 100 and has a display area DA and non-display area NDA.

The touch unit TU according to the illustrated embodiment forms the first sensing electrodes IE1-1 through IE1-5 from a first conductive layer and forms the second sensing electrodes IE2-1 through IE2-4 from a second conductive layer. FIG. 6 shows an example of the first sensing electrodes IE1-1 through IE1-5 and the second sensing electrodes IE2-1 through IE2-4 having the form of a mesh. In an embodiment, the first sensing electrodes IE1-1 through IE1-5 and the second sensing electrodes IE2-1 through IE2-4 may each have a three-layered structure of titanium/aluminum/titanium.

Each of the first sensing electrodes IE1-1 through IE1-5 includes first sensors SP1 and first connectors CP1. Each of the second sensing electrodes IE2-1 through IE2-4 includes second sensors SP2 and second connectors CP2. From among the first sensors SP1, two first sensors SP1 arranged at two opposite ends of the first electrode may have a size smaller than the size of the first sensor SP1 arranged in the center, for example, about one-half the size. From among the second sensors SP2, two second sensors SP2 arranged at two opposite ends of the second electrode may have a size smaller than the size of the second sensor SP2 arranged in the sensor, for example, about one-half the size.

Although FIG. 6 shows a case in which the first sensing electrodes IE1-1 through IE1-5 and the second sensing electrodes IE2-1 through IE2-4 have patterns of particular shapes, the shapes of the first sensing electrodes IE1-1 through IE1-5 and the second sensing electrodes IE2-1 through IE2-4 are not limited. As an embodiment, FIG. 6 shows an example of the first sensors SP1 and the second sensors SP2 having a generally rhomboidal shape. However, the shape of the first sensors SP1 and the second sensors SP2 is not limited thereto, and the first sensors SP1 and the second sensors SP2 may have different generally polygonal shapes. As an embodiment, the first sensing electrodes IE1-1 through IE1-5 and the second sensing electrodes IE2-1 through IE2-4 may have a shape in which a sensor unit and a connection unit are not distinguished from each other (for example, a generally elongated bar shape).

In one first sensing electrode, the first sensors SP1 are aligned in the x direction, and in one second sensing electrode, the second sensors SP2 are aligned in the y direction. Each of the first connectors CP1 connects the first sensors SP1 adjacent to each other and each of the second connectors CP2 connects the second sensors SP2 adjacent to each other.

The first signal lines SL1-1 through SL1-5 are each connected to an end portion of each of the first sensing electrodes IE1-1 through IE1-5. The second signal lines SL2-1 through SL2-4 are each connected to two end portions of each of the second sensing electrodes IE2-1 through IE2-4. As an embodiment, the first signal lines SL1-1 through SL1-5 may each be connected to two end portions of each of the first sensing electrodes IE1-1 through IE1-5. As an embodiment, the second sensing lines SL2-1 through SL2-4 may each be connected only to an end portion of each of the second sensing electrodes IE2-1 through IE2-4.

As a comparative example, sensing sensitivity may be improved compared to the touch unit TU that includes the second signal lines SL2-1 through SL2-4 only each connected to an end portion of each of the second sensing electrodes IE2-1 through IE2-4. As the second sensing electrodes IE2-1 through IE2-4 have greater lengths compared to the first sensing electrodes IE1-1 through IE1-5, voltage drop of a detecting signal (or a transmitting signal) occurs, and thus, sensing sensibility may degrade. According to the illustrated embodiment, a detecting signal (or a transmitting signal) is provided through the second signal lines SL2-1 through SL2-4 each connected to two end portions of each of the second sensing electrodes IE2-1 through IE2-4. Therefore, degradation in the sensing sensibility may be reduced or prevented by preventing voltage drop of the detecting signal (or the transmitting signal).

The first signal lines SL1-1 through SL1-5 and the second signal lines SL2-1 through SL2-4 may each include a line portion SL-L and a pad portion SL-P.

Figure 8A:
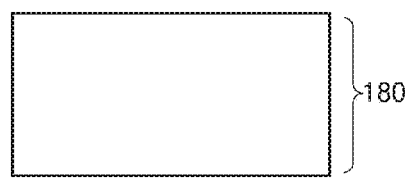
FIGS. 8A and 8B are schematic diagrams of exemplary embodiments of a first pixel electrode and a second pixel electrode of the display apparatus.
Figure 8B:
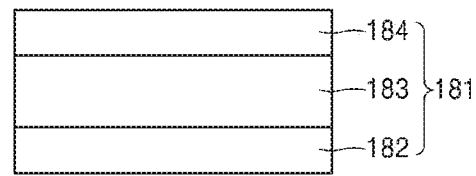

FIG. 7 is a cross-sectional view of an exemplary embodiment of a display apparatus constructed according to principles of the invention, and FIGS. 8A and 8B are schematic diagrams of exemplary embodiments of a first pixel electrode and a second pixel electrode of the display apparatus 1.

Referring to FIGS. 1, 3 and 7, the display apparatus 1 according to this exemplary embodiment includes: the substrate 100 including the first area 1A and the second area 2A; the first pixel electrode 180 arranged in the first area 1A and the second pixel electrode 181 arranged in the second area 2A; the first intermediate layer 200 arranged on the first pixel electrode 180 and the second intermediate layer 201 arranged on the second pixel electrode 181; the first opposite electrode 220 that is arranged to face the first pixel electrode 180 with the first intermediate layer 200 between and having the first transmissivity and the second opposite electrode 221 that is arranged to face the second pixel electrode 181 with the second intermediate layer 201 between and having the second transmissivity that is lower than the first transmissivity.

The substrate 100 may include glass or a polymer resin. The polymer resin may include polyethersulfone (PES), polyacrylate (PAR), polyetherimide (PEI), polyethylene naphthalate (PEN), polyethylene terephthalate (PET), polyphenylene sulfide (PPS), polyarylate, polyimide (PI), polycarbonate (PC), cellulose acetate propionate (CAP), and the like. The substrate 100 which includes the polymer resin may be flexible, rollable, or bendable. The substrate 100 may have a multi-layer structure including the polymer resin and an inorganic layer.

The substrate 100 according to the illustrated embodiment may include a first area 1A and two second areas 2A. The first area 1A is an area through which light may permeate, in which a first display unit 10, as discussed in further detail hereinafter with reference to FIG. 20, may be arranged, and the second area 2A is an area having a light transmissivity lower than a light transmissivity lower of the first area 1A, in which a second display unit 20 may be arranged. Here, 'transmissivity' indicates transmissivity by light. In this case, light may include various kinds of light such as light due to emission of the organic light-emitting diode, foreign light, an infrared ray, an ultraviolet ray, and/or a visible ray.

The buffer layer 110, which is arranged on the substrate 100, may planarize the upper surface of the substrate 100 and prevent permeation of foreign materials from the substrate 100. The buffer layer 110 may include at least one of silicon oxide ($SiO_x$), silicon nitride ($SiN_x$), and silicon oxynitride ($SiO_xN_y$).

The pixel circuit PC of FIG. 3 may be arranged on the buffer layer 110. As described above, the pixel circuit PC may include a thin film transistor TFT and a storage capacitor. The thin film transistor TFT may include an active layer 120, a gate electrode 140, a source electrode 160, and/or a drain electrode 161.

The active layer 120 may be arranged on the buffer layer 110. The active layer 120 may include an oxide semiconductor and/or a silicon semiconductor. When the active layer 120 includes an oxide semiconductor, the active layer 120 may include an oxide of at least one material selected from among indium (In), gallium (Ga), tin (Sn), zirconium (Zr), vanadium (V), hafnium (Hf), cadmium (Cd), germanium (Ge), chromium (Cr), titanium (Ti), and zinc (Zn). For example, the active layer 120 may include an In—Sn—Zn—O (ITZO) active layer, In—Ga—Zn—O (IGZO) active layer, and the like. When the active layer 120 includes a silicon semiconductor, the active layer 120 may include, for example, amorphous silicon (a-Si) or low temperature polysilicon (LTPS).

The gate electrode 140 may be arranged on the active layer 120 with the first insulating layer 130 between the gate electrode 140 and the active layer 120. For example, the gate electrode 140 may include a single layer or multiple layers including one or more metal materials selected from among aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), molybdenum (Mo), titanium (Ti), tungsten (W), and copper (Cu). The gate electrode 140 may be connected to a gate line that applies an electrical signal to the gate electrode 140.

The source electrode 160 and/or the drain electrode 161 may be arranged on the gate electrode 140 with the second insulating layer 150 between the gate electrode 140 and the source electrode 160 and/or the drain electrode 161. The source electrode 160 and/or the drain electrode 161 may be electrically connected to the active layer 120 via a contact hole formed in the second insulating layer 150 and the first insulating layer 130.

Referring to FIG. 7, a third insulating layer 170 may be arranged on the second insulating layer 150. Although the third insulating layer 170 is shown as a single layer in FIG. 7, the third insulating layer 170 may also include multiple layers. The third insulating layer 170 may planarize an upper surface of the thin film transistor to planarize a surface for subsequent disposition of the organic light emitting diode OLED.

The third insulating layer 170 may include, for example, a general commercial polymer like benzocyclobutene (BCB), polyimide, hexamethyldisiloxane (HMDSO), polymethylmethacrylate (PMMA), and polystyrene (PS), a general commercial polymer having a phenolic group, an acrylic polymer, an imide polymer, an arylether polymer, an amide polymer, a fluorinated polymer, a p-xylene polymer, a vinyl alcohol polymer, and a blend thereof. As an embodiment, the third insulating layer 170 may also include an organic material or an inorganic material.

The first pixel electrode 180 may be arranged in the first area 1A of the third insulating layer 170 and the second pixel electrode 181 may be arranged in the second area 2A of the third insulating layer 170. The first pixel electrode 180 and the second pixel electrode 181 may be (semi) transmissive electrodes or reflective electrodes. The first pixel electrode 180 and the second pixel electrode 181 may be electrically connected to the pixel circuit PC via a contact hole formed in the third insulating layer 170.

Referring to FIG. 8A, the first pixel electrode 180 may include a transmissive conductive material and include a transparent or translucent electrode layer. In this case, the transmissive conductive material may include at least one of indium tin oxide (ITO), indium zinc oxide (IZO), zinc oxide (ZnO), indium oxide ($In_2O_3$), indium gallium oxide (IGO), and aluminum zinc oxide (AZO).

In addition, referring to FIG. 8B, unlike the first pixel electrode 180, the second pixel electrode 181 may include a reflective conductive material. In an embodiment, the second pixel electrode 181 may include a first layer 182 that includes a transmissive conductive material and a second layer 183 that includes a reflective conductive material. In addition, the second pixel electrode 181 may further include a third layer 184 that includes a transmissive conductive material.

In this case, the transmissive conductive material may include at least one of ITO, IZO, ZnO, $In_2O_3$, IGO, AZO, and the reflective conductive material may include at least one of Ag, Mg, Al, Pt, Pd, Au, Ni, Nd, Ir, Cr, and a compound thereof. For example, the second pixel electrode 181 may be provided as an ITO/Ag/ITO stack structure.

As described in FIG. 7, the first pixel electrode 180 is arranged in the first area 1A and the second pixel electrode 181 is arranged in the second area 2A. The first area 1A, through which light may be transmitted, requires light transmissivity that is higher than light transmissivity of the second area 2A. Therefore, by forming the first pixel electrode 180 in the first area 1A with a transmissive conductive material, the first pixel electrode 180 may have light transmissivity higher than light transmissivity of the second pixel electrode 181 that includes a reflective conductive material.

A pixel defining layer 190 may be arranged on the first pixel electrode 180 and the second pixel electrode 181. The pixel defining layer 190 may define an emission area of a pixel by having openings that expose center portions of the first pixel electrode 180 and the second pixel electrode 181. In addition, the pixel defining layer 190 may prevent arcs and the like from occurring at edges of the first pixel electrode 180 and the second pixel electrode 181 by increasing a distance between the edges of the first pixel electrode 180 and the second pixel electrode 181 and the first opposite electrode 220 and the second opposite electrode 221 on the first pixel electrode 180 and the second pixel electrode 181. The pixel defining layer 190 may include an organic insulating material such as polyimide, polyamide, an acryl resin, BCB, HMDSO, and a phenolic resin, and may be formed by a spin coating method and the like.

A first intermediate layer 200 may be arranged on the first pixel electrode 180 exposed by the pixel defining layer 190, and a second intermediate layer 201 may be arranged on the second pixel electrode 181 exposed by the pixel defining layer 190. The first intermediate layer 200 and the second intermediate layer 201 may each include an organic emission layer and alternatively include a functional layer such as a hole transport layer (HTL), a hole injection layer (HIL), an electron transport layer (ETL), an electron injection layer (EIL) and the like under and above the organic emission layer.

The organic emission layer may include an organic material including a fluorescent material or a phosphorescent material each emitting red, green, blue, or white light. The organic emission layer may include a low molecular weight organic material or a high molecular weight organic material.

The first pixel electrode 180 and the second pixel electrode 181 may be provided in plural numbers, and the first intermediate layer 200 and the second intermediate layer 201 may respectively arranged to correspond to the first pixel electrodes 180 and the second pixel electrodes 181. However, the first intermediate layer 200 and the second intermediate layer 201 are not limited thereto. The first intermediate layer 200 and the second intermediate layer 201 may be variously modified, for example, to include a layer that is integrally formed across the first pixel electrodes 180 and the second pixel electrodes 181. In an embodiment, the organic emission layer is arranged to correspond to each of the first pixel electrodes 180 and the second pixel electrodes 181, and the functional layer(s) except the organic emission layer may be integrally formed over the first pixel electrodes 180 and the second pixel electrodes 181.

A first opposite electrode 220 may be arranged on the first intermediate layer 200 and a second opposite electrode 221 may be arranged on the second intermediate layer 201. The first opposite electrode 220 may be arranged opposite to the first pixel electrode 180 with the first intermediate layer 200 between the first opposite electrode 220 and the first pixel electrode 180; and the second opposite electrode 221 may be arranged opposite to the second pixel electrode 181 with the second intermediate layer 201 between the second opposite electrode 221 and the second pixel electrode 181.

The first opposite electrode 220 may have first transmissivity and the second opposite electrode 221 may have second transmissivity that is lower than the first transmissivity.

The first opposite electrode 220 may be a transmissive electrode including a transmissive conductive material. In an embodiment, the first opposite electrode 220 may be a transparent or a translucent electrode and include at least one material from among the following transmissive conductive materials: ITO, IZO, ZnO, $In_2O_3$, IGO, and AZO.

The second opposite electrode 221 may include a reflective conductive material. In an embodiment, the second opposite electrode 221 may include a reflective electrode and include a metal thin film that includes lithium (Li), calcium (Ca), lithium fluoride (LiF)/Ca, LiF/Al, Al, Ag, Mg, and a compound thereof and has a work small function. As an alternative embodiment, a transparent conductive oxide (TCO) layer such as ITO, IZO, ZnO, or $In_2O_3$ may be further arranged on the second opposite electrode 221.

The first opposite electrode 220 and the second opposite electrode 221 may be arranged over the display area DA and the non-display area NDA and arranged on the first intermediate layer 200, the second intermediate layer 201, and the pixel defining layer 190. The first opposite electrode 220 and the second opposite electrode 221 may be integrally formed with a plurality of organic light-emitting diodes OLEDS and correspond to the first pixel electrodes 180 and the second pixel electrodes 181.

The second opposite electrode 221 according to an embodiment may be arranged only in the second area 2A; the first opposite electrode 220 may be arranged over the first area 1A and the second area 2A and in contact with at least a portion of the second opposite electrode 221.

Referring to FIG. 7, the first opposite electrode 220 may be arranged over an entire portion of the second opposite electrode 221 and be in contact with the second opposite electrode 221.

Figure 9:
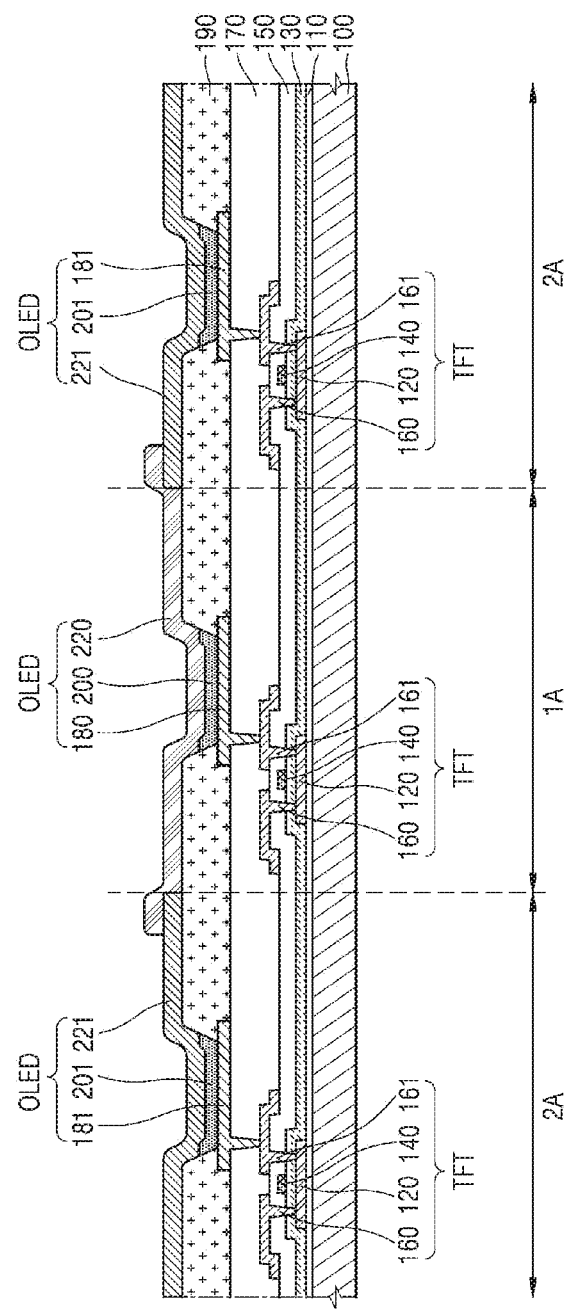
FIG. 9 is a cross-sectional view of another exemplary embodiment of the display apparatus.

FIG. 9 is a cross-sectional view of another exemplary embodiment of a display apparatus, and schematically shows a structure in which at least portion of the first opposite electrode 220 is arranged on the second opposite electrode 221. In FIGS. 9-16, the detailed description of the same or similar elements as described above will be shortened or omitted to avoid redundancy.

Referring to FIG. 9, unlike in FIG. 7, the first opposite electrode 220 may be patterned to correspond to the first area 1A. In other words, the first opposite electrode 220 of FIG. 7 is provided over an entire portion of the first area 1A and the second area 2A; on the other hand, the first opposite electrode 220 shown in FIG. 9 is patterned to correspond to the first area 1A and at least partially extends to the second area 2A to overlap the second opposite electrode 221. The first opposite electrode 220 extending to the second area 2A may be arranged on the second opposite electrode 221 in the second area 2A adjacent to the first area 1A and be in direct contact with the second opposite electrode 221.

Figure 10:
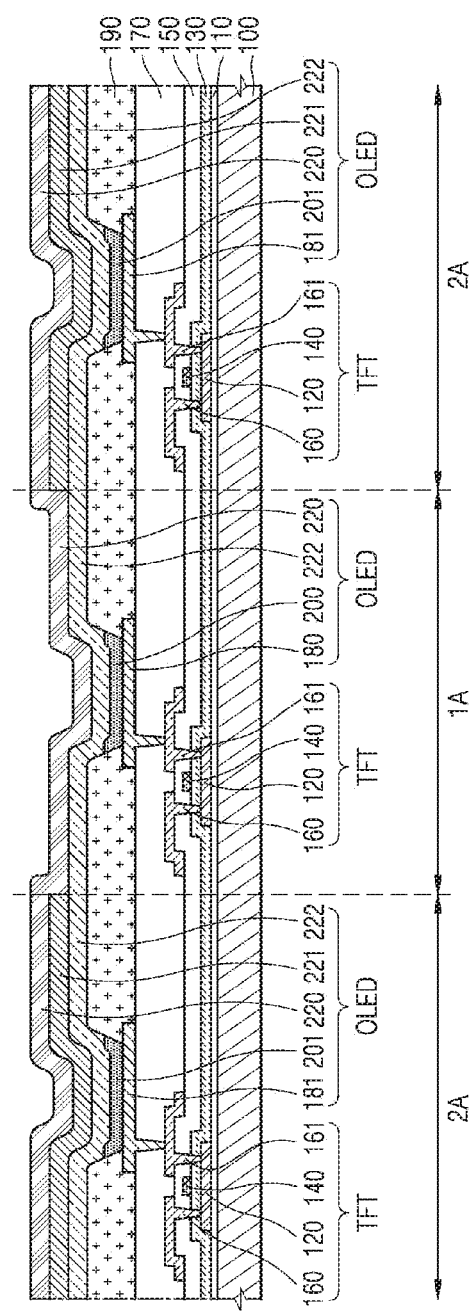
FIGS. 10 and 11 are cross-sectional views of other exemplary embodiments of the display apparatus.
Figure 11:
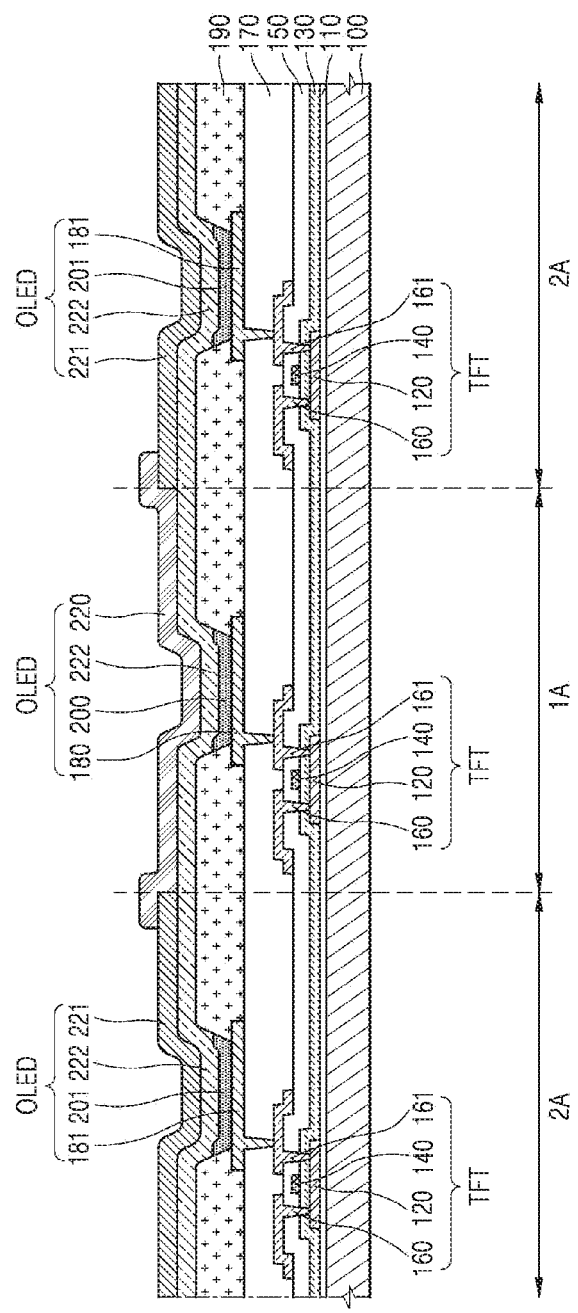

FIGS. 10 and 11 are cross-sectional views of other exemplary embodiments of the display apparatus 1. FIG. 10 schematically shows a structure further including a third opposite electrode 222; and FIG. 11 schematically shows a structure further including the third opposite electrode 222, in which at least a portion of the first opposite electrode 220 is arranged on the second opposite electrode 221.

Referring to FIGS. 10 and 11, the display apparatus 1 according to an embodiment may further include the third opposite electrode 222 between the first intermediate layer 200 and the first opposite electrode 220 and further include the third opposite electrode 222 between the second intermediate layer 201 and the second opposite electrode 221.

The third opposite electrode 222 may be a transmissive electrode including a transmissive conductive material or a reflective electrode. In an embodiment, the third opposite electrode 222 may be a transparent or translucent electrode and include at least one of the following transmissive conductive materials: ITO, IZO, ZnO, $In_2O_3$, IGO, and AZO. The third opposite electrode 222 may also include a material same as the first opposite electrode 220. As an alternative embodiment, the third opposite electrode 222 may include a metal thin film including a reflective conductive material such as Li, Ca, LiF/Ca, LiF/Al, Al, Mg, Ag, and a compound thereof and having a small work function.

As the third opposite electrode 222 is formed between the first intermediate layer 200, the first opposite electrode 220, the second intermediate layer 201, and the second opposite electrode 221, damage to the first intermediate layer 200 and the second intermediate layer 201 in processes may be prevented, and the first opposite electrode 220 and the second opposite electrode 221 may be easily in contact with each other.

As shown in FIG. 10, the first opposite electrode 220 may be arranged over an entire portion of the second opposite electrode 221 and be in contact with the second opposite electrode 221. As shown in FIG. 11, the first opposite electrode 220 may be patterned to correspond to the first area 1A and at least partially extend to the second area 2A and overlap the second opposite electrode 221. The first opposite electrode 220 extending to the second area 2A may be arranged on the second opposite electrode 221 in the second area 2A adjacent to the first area 1A and be in direct contact with the second opposite electrode 221.

Figure 12:
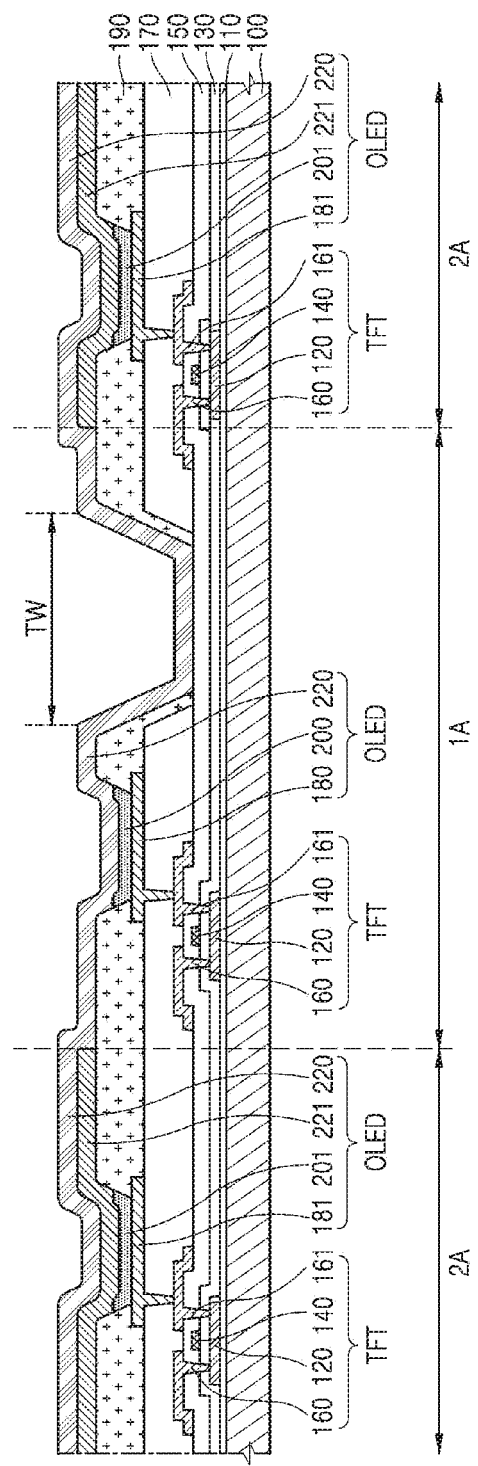
FIGS. 12 and 13 are cross-sectional views of still, other exemplary embodiments of the display apparatus.
Figure 13:
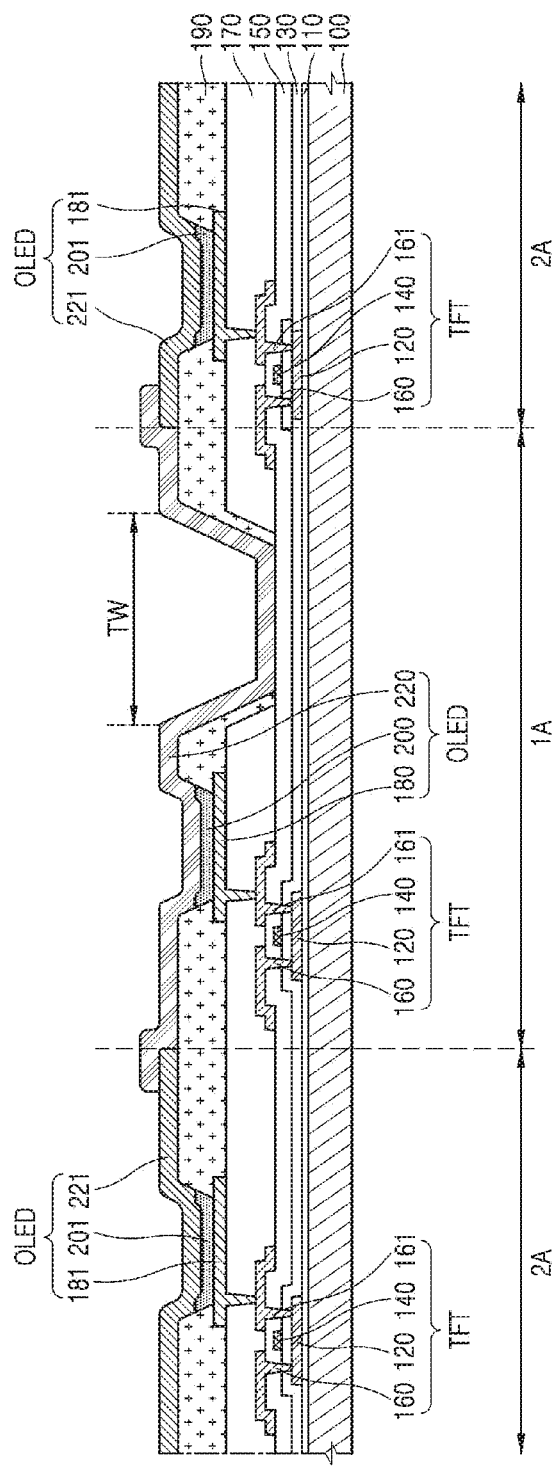

FIGS. 12 and 13 are cross-sectional views of still, other exemplary embodiments of the display apparatus 1. FIG. 12 schematically shows a structure further including the transmission window TW and FIG. 13 schematically shows a structure further including the transmission window in which at least a portion of the first opposite electrode 220 is arranged on the second opposite electrode 221.

Referring to FIGS. 12 and 13, the first area 1A is an area through which light may be transmitted. To enhance transmissivity of the first area 1A, a transmission window TW including an opening may be arranged in the first area 1A.

A plurality of transmission windows TW may be in the first area 1A, and according to sizes of the transmission windows TW, one transmission window TW may correspond to an entire portion of the first area 1A. The transmission window TW may be formed on the second insulating layer 150 and the pixel defining layer 190. Although FIGS. 12 and 13 show the transmission window TW provided on the second insulating layer 150 and the pixel defining layer 190, as a particular embodiment, the transmission window TW may be arranged on at least one of the buffer layer 110, the first insulating layer 130, the second insulating layer 150, the third insulating layer 170, and the pixel defining layer 190 or only on a selective layer.

The transmission window TW may be provided in a plural number, and in this case, sizes of the transmission windows TW may be approximately identical to sizes of the pixels. As a particular embodiment, the transmission window may be formed of a greater size than the size of each pixel or formed in a size corresponding to the entire portion of the first area 1A.

The organic light-emitting diode OLED may not be in the transmission window TW. That is, the organic light-emitting diode OLED may not be in the transmission window TW in the first area 1A. The transmission window TW may transmit light emitted from a neighboring organic light-emitting diode OLED and enhance the transmissivity of the first area 1A.

A display apparatus according to an embodiment may further include the transmission window TW to enhance the transmissivity of the first area 1A, and as shown in FIG. 12, the first opposite electrode 220 may be arranged over an entire portion of the second opposite electrode 221 and be in contact with the second opposite electrode 221.

In addition, as shown in FIG. 13, the first opposite electrode 220 may be patterned to correspond to the first area 1A and at least a portion of the first opposite electrode 220 may extend to the second area 2A and overlap the second opposite electrode 221. The first opposite electrode 220 extended to the second area 2A may be arranged on the second opposite electrode 221 in the second area 2A that is adjacent to the first area 1A and be in direct contact with the second opposite electrode 221.

Figure 14:
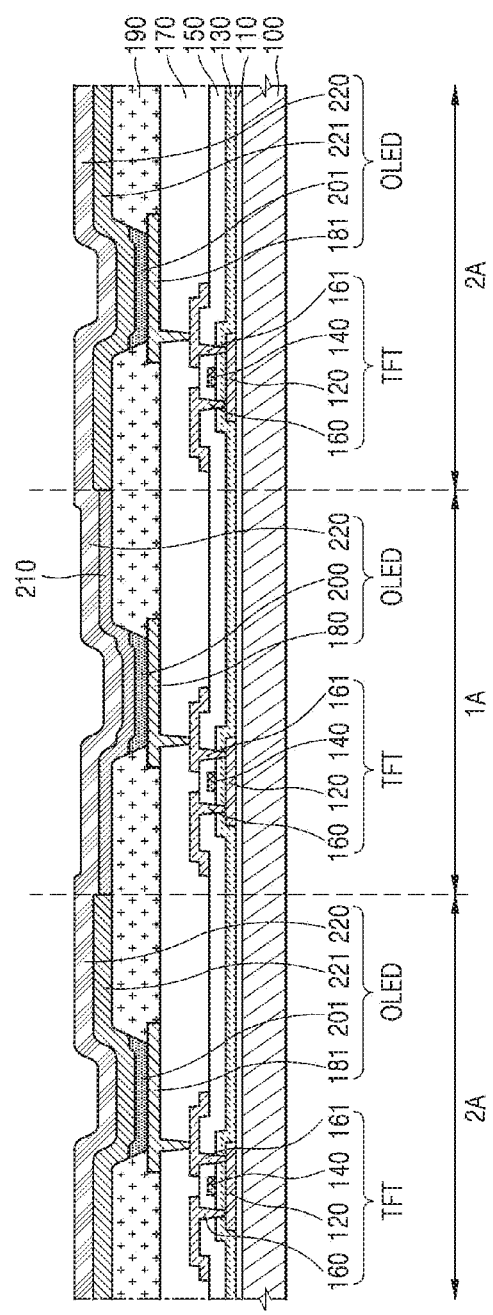
FIGS. 14 and 15 are cross-sectional views of still, other exemplary embodiments of the display apparatus.
Figure 15:
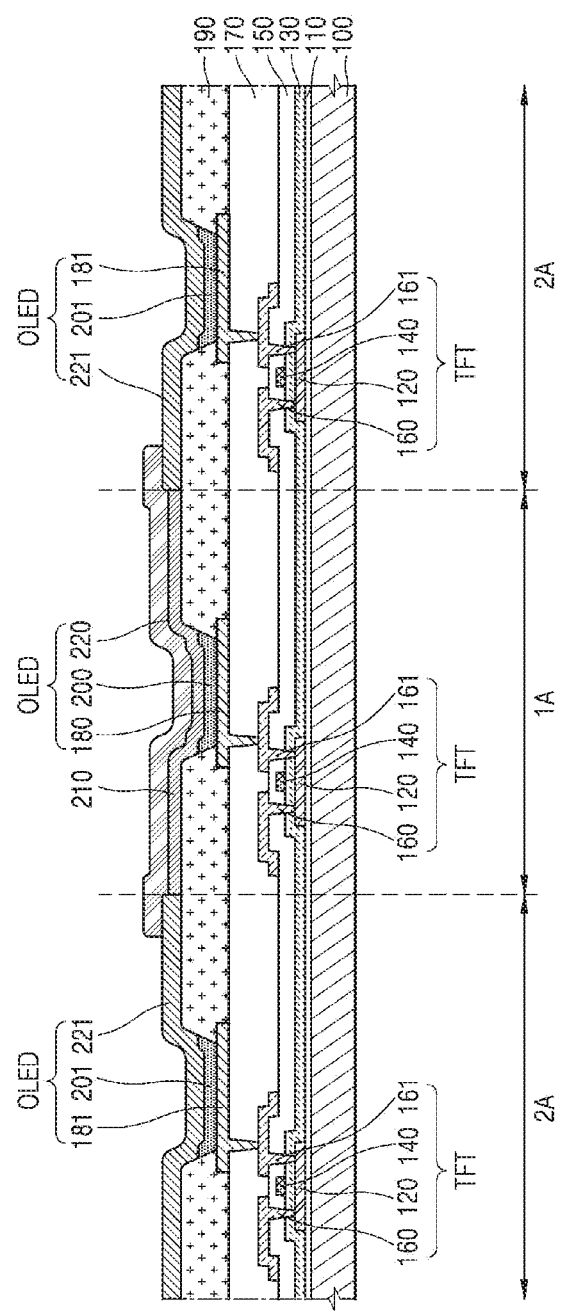

FIGS. 14 and 15 are cross-sectional views of still, other exemplary embodiments of the display apparatus 1. FIG. 14 schematically shows a structure further including a liquid-repelling layer 210, and FIG. 15 schematically shows a structure further including the liquid-repelling layer 210 in which at least a portion of the first opposite electrode 220 is disposed on the second opposite electrode 221.

Referring to FIGS. 14 and 15, the display apparatus 1 may further include the liquid-repelling layer 210 disposed between the first intermediate layer 200 and the first opposite electrode 220. The liquid-repelling layer 210, which is formed on the first intermediate layer 200, may give a liquid-repelling property to the first intermediate layer 200 such that a metal electrode is not formed on the first intermediate layer 200.

Generally, an organic material and a metal material are not easily formed on a material that has a low surface energy. Accordingly, the liquid-repelling layer 210 may include a liquid-repelling material having a surface energy equal to or less than about 20 $mJ/m^2$ such that a metal material is not formed, and the liquid-repelling material may include at least one of a fluoro material, a perfluoro material, and a self-assembled monolayer (SAM).

The SAM, which is an organic assembly formed by absorption of a molecule structure from liquid or gas, may include at least one material from among alkanethiols, alkylsiloxanes, alkylphosphonic acid, and 3,4-dihydroxyphenylethylamine (dopamine).

Figure 16:
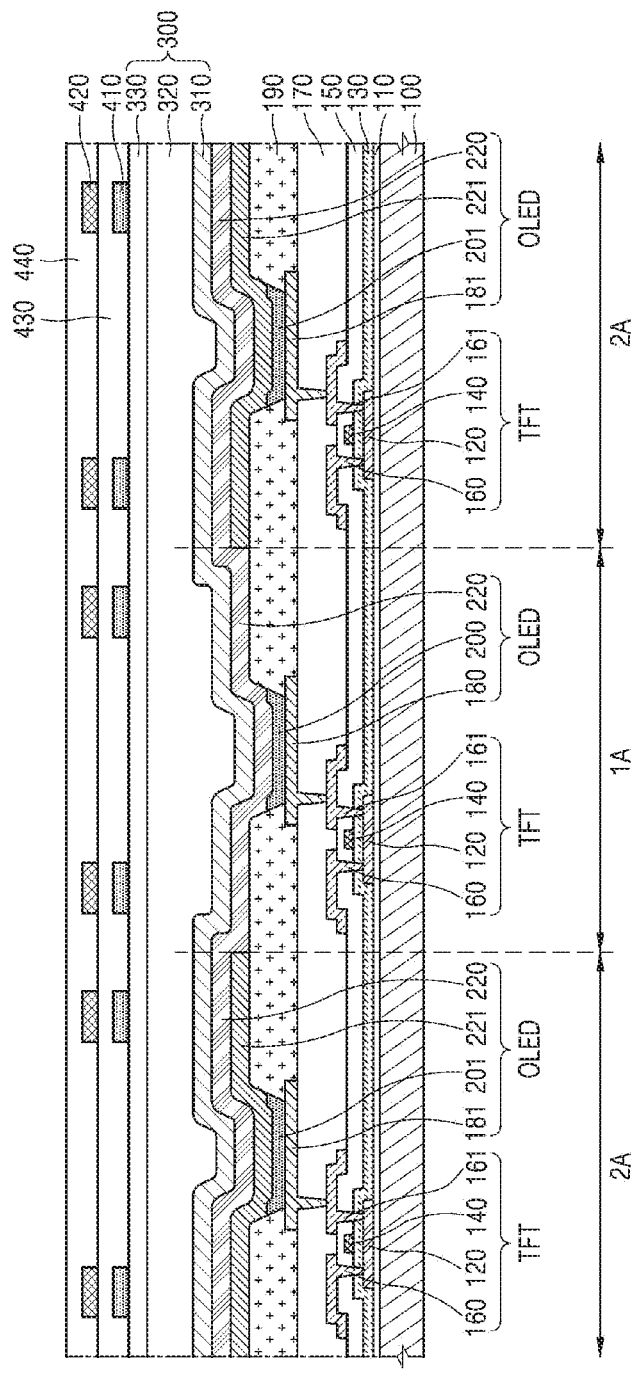
FIG. 16 is a cross-sectional view of another exemplary embodiment of the display apparatus.

FIG. 16 is a cross-sectional view of another exemplary embodiment of a display apparatus. Referring to FIG. 16, a thin film encapsulation layer 300 on the organic light-emitting diode may protect the organic light-emitting diode from foreign moisture and oxygen. The thin film encapsulation layer 300 may include at least one organic encapsulation layer and at least one inorganic encapsulation layer.

The thin film encapsulation layer 300 may include: a first inorganic encapsulation layer 310; a second inorganic encapsulation layer 330 disposed on the first inorganic encapsulation layer; and an organic encapsulation layer 320 between the first inorganic encapsulation layer 310 and the second inorganic encapsulation layer 330.

The first inorganic encapsulation layer 310 and the second inorganic encapsulation layer 330 may include at least one inorganic material from among aluminum oxide, titanium oxide, tantalum oxide, hafnium oxide, zinc oxide, silicon oxide, silicon nitride, and silicon oxynitride. The first inorganic encapsulation layer 310 and the second inorganic encapsulation layer 330 may each include a single layer or multiple layers including the above-mentioned materials. The first inorganic encapsulation layer 310 and the second inorganic encapsulation layer 330 may include a same material or different materials.

The thickness of the first inorganic encapsulation layer 310 may be different from the thickness of the second inorganic encapsulation layer 330. The thickness of the first inorganic encapsulation layer 310 may be greater than the thickness of the second inorganic encapsulation layer 330. Alternatively, the thickness of the second inorganic encapsulation layer 330 may be greater than the thickness of the first inorganic encapsulation layer 310 or the thickness of the first inorganic encapsulation layer 310 may be identical to the thickness of the second inorganic encapsulation layer 330.

The organic encapsulation layer 320 may include a monomer-based material or a polymer-based material. The organic encapsulation layer 320 may include polyethylene terephthalate, polyethylene naphthalate, polycarbonate, polyimide, polyethylene sulfonate, polyoxymethylene, polyarylate, hexamethylene disiloxane, an acryl-based resin (for example, polymethyl methacrylate, polyacryl acid, and the like) or another independent combination of the above-mentioned materials.

In addition, the touch unit TU may be formed on the second inorganic encapsulation layer 330.

The touch unit TU may include a sensing electrode, which is arranged to correspond to the display area DA, and a signal line arranged to correspond to the non-display area NDA and connected to the sensing electrode.

The sensing electrode may include: a first conductive layer 410; a second conductive layer 420 arranged on the first conductive layer 410; a first touch insulating layer 430 arranged between the first conductive layer 410 and the second conductive layer 420; and a second touch insulating layer 440 disposed on the second conductive layer 420.

The sensing electrode including a metal layer may have the form of a mesh to prevent recognition of the user. In addition, as shown in FIG. 16, the sensing electrode may not be formed in an area where the organic light-emitting diode is formed.

Figure 17:
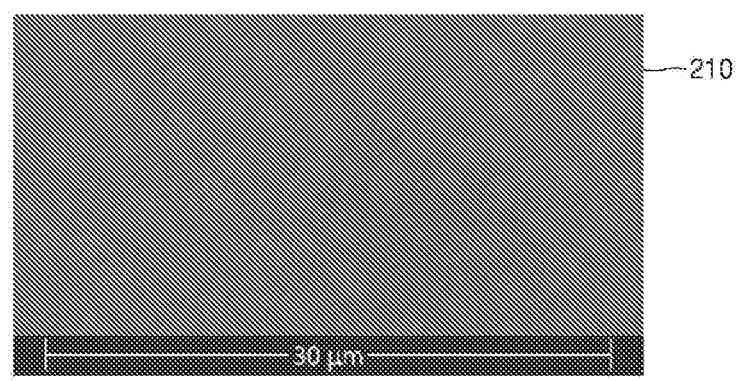
FIG. 17 depicts an image of an exemplary embodiment of metal cohering on a liquid-repelling layer formed according to principles of the invention.

FIG. 17 depicts an image of an exemplary embodiment of metal cohering on the liquid-repelling layer 210 formed according to principles of the invention.

Referring to FIG. 17, as an embodiment, when a metal electrode (AgMg) is formed on the SAM, it is recognized that the metal electrode (AgMg) is not formed and the metal coheres on the liquid-repelling layer 210.

Figure 18A:
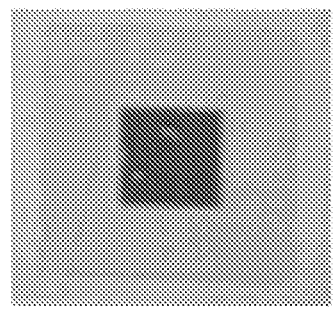
FIGS. 18A and 18B are schematic diagrams for comparing, respectively, clarity of cases of forming metal electrodes on a substrate and a liquid-repelling layer.
Figure 18B:
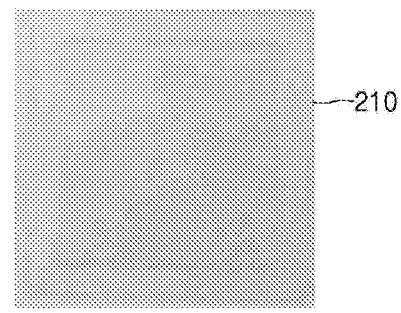

FIGS. 18A and 18B are schematic diagrams for comparing, respectively, clarity of cases of forming metal electrodes on a substrate and a liquid-repelling layer 210. The substrate of FIG. 18A shows clarity when the metal electrode is formed on the substrate and the liquid-repelling layer 210 of FIG. 18B shows clarity when the metal electrode is formed on the SAM.

Referring to FIGS. 18A-B, it is recognized that the metal electrode formed on the SAM is clearer than the metal electrode formed on the substrate.

Figure 19:
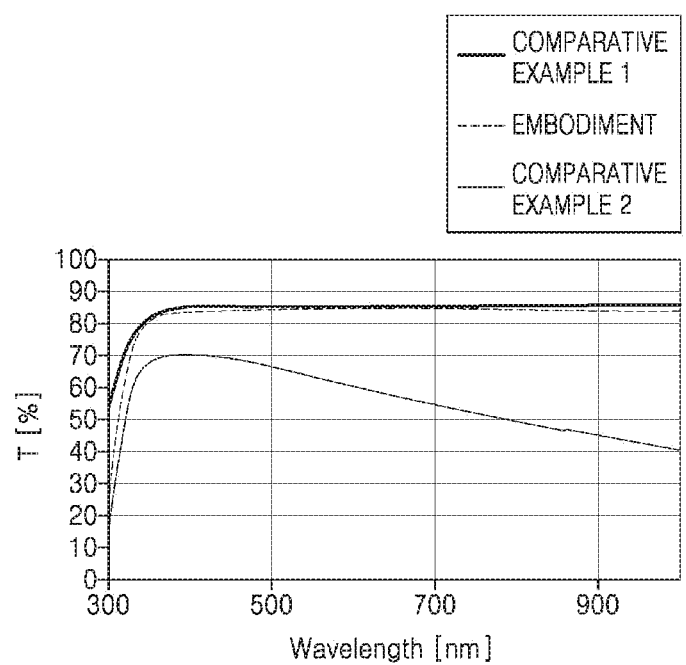
FIG. 19 is a graphical comparison of an exemplary embodiment of transmissivity according to wavelength of an Exemplary Embodiment, Comparative Example 1, and Comparative Example 2.

FIG. 19 is a graphical comparison of an exemplary embodiment of transmissivity according to wavelength of an Exemplary Embodiment, Comparative Example 1, and Comparative Example 2. Particularly, FIG. 19 shows a graph of transmissivity in percent versus wavelength in nanometers of a case of forming the metal electrode (AgMg) on the SAM (Exemplary Embodiment), a glass substrate (Comparative Example 1), and a case of forming the metal electrode (AgMg) on the glass substrate (Comparative Example 2).

Referring to FIG. 19, it is recognized that a transmissivity in the Exemplary Embodiment according to the principles of the invention is higher than a transmissivity in the Comparative Example 2 and a transmissivity in the Example is noticeably closer to a transmissivity in the Comparative Example 1 than to the transmissivity in the Comparative Example 2.

Therefore, according to FIGS. 17 and 19, it is recognized that the metal electrode is not substantially formed on the liquid-repelling layer 210 when the liquid-repelling layer 210 is formed by using the SAM.

The liquid-repelling layer 210 may be arranged between the first intermediate layer 200 and the first opposite electrode 220 such that a metal material is not formed on the first intermediate layer 200 of the first area 1A.

However, the liquid-repelling layer 210 may be completely removed by a process of forming the first opposite electrode 220 or partially remain on the first intermediate layer 200.

Figure 20:
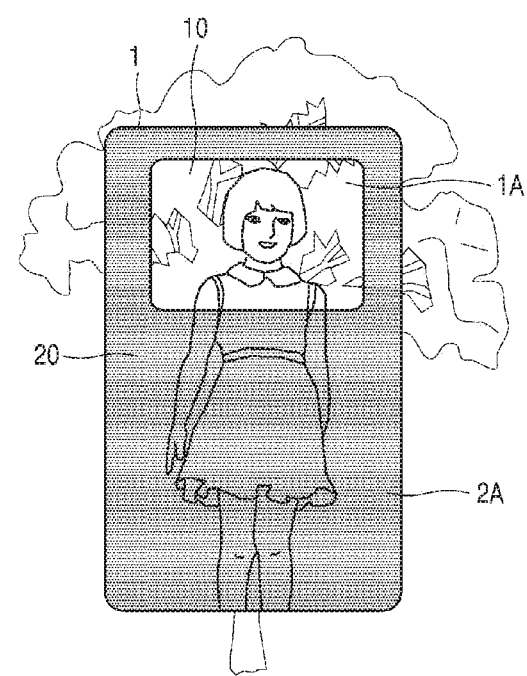
FIG. 20 is a schematic diagram of an exemplary embodiment of an electronic device constructed according to principles of the invention.

FIG. 20 is a schematic diagram of an exemplary embodiment of an electronic device constructed according to principles of the invention.

Referring to FIG. 20, according to the illustrated embodiment, a first display unit 10 may be arranged in the first area 1A of the display apparatus 1 and a second display unit 20 may be arranged in the second area 2A. The first area 1A is an area having transmissivity higher than transmissivity of the second area 2A. Unlike the second display unit 20 arranged in the second area 2A, the first display unit 10 arranged in the first area 1A may be used as a transparent display unit.

In this case, it may be understood that the transparent display unit indicates clarity sufficient to transmit light.

Figure 21:
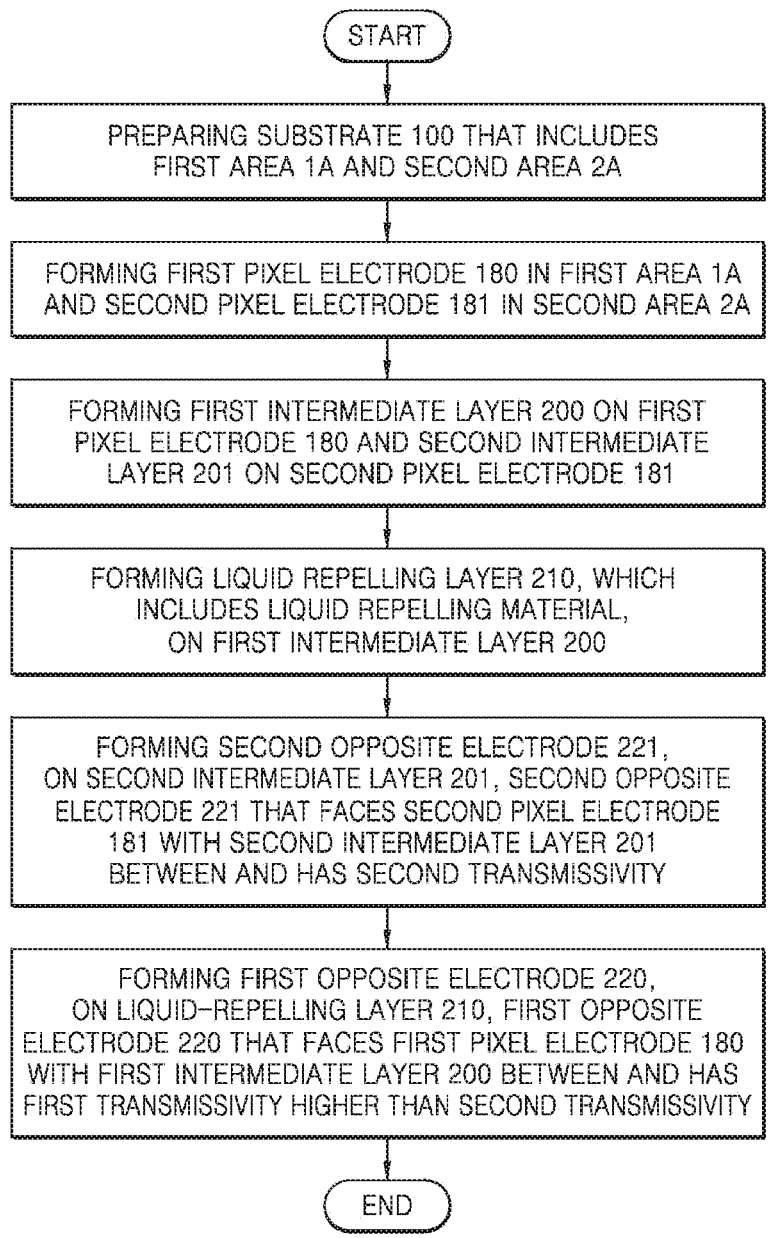
FIG. 21 is a flowchart of an exemplary method of manufacturing a display apparatus according to principles of the invention.

FIG. 21 is a flowchart of an exemplary method of manufacturing the display apparatus 1 according to principles of the invention.

Hereinafter, the method of manufacturing the display apparatus 1 is sequentially described with reference to FIG. 21.

Referring to FIG. 21, the method of manufacturing the display apparatus 1 according to an embodiment includes: preparing the substrate 100 that includes the first area 1A and the second area 2A; forming the first pixel electrode 180 in the first area 1A and the second pixel electrode 181 in the second area 2A; forming the first intermediate layer 200 on the first pixel electrode 180 and the second intermediate layer 201 on the second pixel electrode 181; forming the liquid-repelling layer 210, which includes a liquid repelling material, on the first intermediate layer 200; forming, on the second intermediate layer 201, the second opposite electrode 221 that faces the second pixel electrode 181 with the second intermediate layer 201 between and has second transmissivity; and forming, on the liquid-repelling layer 210, the first opposite electrode 220 that faces the first pixel electrode 180 having the first intermediate layer 200 between and has first transmissivity higher than the second transmissivity.

First, the substrate 100 may be prepared on a carrier substrate. The carrier substrate may be separated from the substrate 100 after the components of the display apparatus 1 are all stacked.

The substrate 100 may include glass or plastic. When the substrate 100 includes glass, the substrate 100 may be on the carrier substrate by vacuum absorption and the like. When the substrate 100 includes plastic, a substrate composition may be, for example, a precursor composition liquid of polyethersulfone (PES), polyacrylate (PAR), polyetherimide (PEI), polyethylene naphthalate (PEN), polyethylene terephthalate (PET), polyphenylene sulfide (PPS), polyarylate, polyimide (PI), polycarbonate (PC), or cellulose acetate propionate (CAP).

In the forming of the substrate 100 that includes the first area 1A and the second area 2A, after the substrate composition is coated on the carrier substrate, the substrate 100 may be formed by curing the substrate composition. For example, a polyimide (PI) substrate may be formed by curing a polyamic acid composition liquid.

The buffer layer 110, the active layer 120, the first insulating layer 130, the gate electrode 140, the second insulating layer 150, the source electrode 160, the drain electrode 161, and the third insulating layer 170 may be formed on the substrate 100. As the process may be performed by any suitable known photo process and the like, a detailed description is not necessary and will be omitted.

After the preparing of the substrate 100, the forming of the first pixel electrode 180 in the first area 1A and the forming of the second pixel electrode 181 in the second area 2A may be further performed.

The first pixel electrode 180 may include a transmissive conductive material and include a transparent or translucent electrode layer. In this case, the transmissive conductive material may include at least one of indium tin oxide (ITO), indium zinc oxide (IZO), zinc oxide (ZnO), indium oxide ($In_2O_3$), indium gallium oxide (IGO), and aluminum zinc oxide (AZO).

Referring to FIGS. 7 and 8B, unlike the first pixel electrode 180, the second pixel electrode 181 may include a reflective conductive material. In an embodiment, the second pixel electrode 181 may include a first layer 182 that includes a transmissive conductive material and a second layer 183 that includes a reflective conductive material. In addition, the second pixel electrode 181 may further include a third layer 184 that includes a transmissive conductive material.

In this case, the transmissive conductive material may include at least one of ITO, IZO, ZnO, $In_2O_3$, IGO, AZO, and the reflective conductive material may include at least one of Ag, Mg, Al, Pt, Pd, Au, Ni, Nd, Ir, Cr, and a compound thereof. For example, the second pixel electrode 181 may be provided as an ITO/Ag/ITO stack structure.

The pixel defining layer 190, which has openings to expose center portions of the first pixel electrode 180 and the second pixel electrode 181, may be formed on the first pixel electrode 180 and the second pixel electrode 181.

As a particular embodiment, a transmission window shaped as an opening may be formed in the first area 1A to enhance transmissivity of the first area 1A.

A plurality of transmission windows TW may be formed in the first area 1A, and according to sizes of the transmission windows TW, one transmission window TW may correspond to the entire portion of the first area 1A. The transmission window TW may be formed on at least one of the buffer layer 110, the first insulating layer 130, the second insulating layer 150, the third insulating layer 170, and the pixel defining layer 190 or only on a selective layer.

The transmission window TW may be provided in a plural number, and in this case, sizes of the transmission windows TW may be approximately identical to sizes of the pixels. In addition, the transmission window may have a greater size than each of the pixels or have a size corresponding to the entire portion of the first area 1A.

The organic light-emitting diode OLED may not be in the transmission window TW. That is, the organic light-emitting diode OLED may not be in the transmission window TW in the first area 1A. The transmission window TW may transmit light emitted from a neighboring organic light-emitting diode OLED and enhance the transmissivity of the first area 1A.

After the forming of the first pixel electrode 180 and the second pixel electrode 181, the forming of the first intermediate layer 200 on the first pixel electrode 180 and the forming of the second intermediate layer 201 on the second pixel electrode 181 may be further performed.

The first intermediate layer 200 and the second intermediate layer 201 may each include an organic light emission layer and further include a functional layer such as a hole transport layer (HLT), a hole injection layer (HIL), an electron transport layer (ETL), and an electron injection layer (EIL) under or above the organic emission layer.

The organic emission layer may include an organic material including a fluorescent material or a phosphorescent material each emitting red, green, blue, or white light. The organic emission layer may include a low molecular weight organic material or a high molecular weight organic material.

The first pixel electrode 180 and the second pixel electrode 181 may be respectively provided in a plural number, and the first intermediate layer 200 and the second intermediate layer 201 may be formed to correspond to each of the plurality of first pixel electrodes 180 and the plurality of second pixel electrode 181. However, the first intermediate layer 200 and the second intermediate layer 201 are not limited thereto. The first intermediate layer 200 and the second intermediate layer 201 may be variously modified, for example, to include a layer that is integrally formed across the plurality of first pixel electrode 180 and the second pixel electrodes 181. As an embodiment, the organic emission layer is formed to correspond to each of the plurality of first pixel electrodes 180 and the plurality of second pixel electrodes 181, and functional layers except the organic emission layer may be integrally formed over the plurality of first pixel electrodes 180 and the second pixel electrodes 181.

After the forming of the first intermediate layer 200 and the second intermediate layer 201, the forming of the liquid-repelling layer 210, which includes a liquid repelling material, on the first intermediate layer 200, may be further performed. The liquid-repelling layer 210, which is arranged on the first intermediate layer 200, may give a liquid repelling property to the first intermediate layer 200 such that a metal electrode is not formed on the first intermediate layer 200.

Generally, an organic material and metal are not smoothly formed on a material that has a low surface energy. Accordingly, the liquid-repelling layer 210 may include liquid repelling material having a surface energy equal to or less than about 20 mJ/m² such that a metal material is not formed, and the liquid repelling material may include at least one of a fluoro material, a perfluoro material, and a SAM.

The liquid-repelling layer 210 may be formed between the first intermediate layer 200 and the first opposite electrode 220 such that a metal material is not formed on the first intermediate layer 200 of the first area 1A.

The liquid-repelling layer 210 may be completely removed by the process of forming the first opposite electrode 220 or partially remain on the first intermediate layer 200.

As a particular embodiment, before the forming of the liquid-repelling layer 210, the forming of the third opposite electrode 222 on the first intermediate layer 200 and the second intermediate layer 201 may be further performed.

As depicted in FIGS. 10-11, the third opposite electrode 222 may be a transmissive electrode including a transmissive conductive material or a reflective electrode. In an embodiment, the third opposite electrode 222 may be a transparent or translucent electrode and include at least one of the following transmissive conductive materials: ITO, IZO, ZnO, In$_2$O$_3$, IGO, and AZO. The third opposite electrode 222 may also include a material same as the first opposite electrode 220. As an alternative embodiment, the third opposite electrode 222 may include a metal thin film including a reflective conductive material such as Li, Ca, LiF/Ca, LiF/Al, Al, Mg, Ag, and a compound thereof and having a small work function.

As the third opposite electrode 222 is formed between the first intermediate layer 200, the first opposite electrode 220, the second intermediate layer 201, and the second opposite electrode 221, damage to the first intermediate layer 200 and the second intermediate layer 201 in processes may be reduced or prevented, and the first opposite electrode 220 and the second opposite electrode 221 may be easily in contact with each other.

After the forming of the liquid-repelling layer 210, the following processes may be further performed: forming the second opposite electrode 221, on the second intermediate layer 201, the second opposite electrode 221 that faces the second pixel electrode 181 with the second intermediate 201 between and has the second transmissivity; and forming the first opposite electrode 220, on the liquid-repelling layer 210, the first opposite electrode 220 that faces the first pixel electrode 180 with the first intermediate layer 200 between and has the first transmissivity higher than the second transmissivity.

The first opposite electrode 220 may be a transmissive electrode including a transmissive conductive material. In an embodiment, the first opposite electrode 220 may be a transparent or a translucent electrode and include at least one material from among the following transmissive conductive materials: ITO, IZO, ZnO, In$_2$O$_3$, IGO, and AZO.

The second opposite electrode 221 may include a reflective conductive material. In an embodiment, the second opposite electrode 221 may be a transparent or translucent electrode and may include a metal thin film that includes lithium (Li), calcium (Ca), lithium fluoride (LiF)/Ca, LiF/Al, Al, Ag, Mg, and a combination thereof and has a small work function. As a particular embodiment, a transparent conductive oxide (TCO) layer such as ITO, IZO, ZnO, or In$_2$O$_3$ may be further formed on the second opposite electrode 221.

The first opposite electrode 220 and the second opposite electrode 221 are formed over the display area DA and the non-display area NDA and formed on the first intermediate layer 200, the second intermediate layer 201, and the pixel defining layer 190. The first opposite electrode 220 and the second opposite electrode 221 may be formed in a single body with a plurality of organic light-emitting diodes OLEDs and correspond to the plurality of first pixel electrodes 180 and the second pixel electrodes 181.

The second opposite electrode 221 may be arranged only in the second area 2A, the first opposite electrode 220 may be arranged over the first area 1A and the second area 2A and be in contact with at least a portion of the second opposite electrode 221.

According to the principles and exemplary embodiments of the invention, to solve a drawback of a display apparatus in the related art that an electrode layer may not be properly formed in a portion of a panel to realize full screen display, a display apparatus and a method of manufacturing the same may be provided in which a liquid-repelling layer is formed by using a liquid repelling material to selectively form an electrode layer in a portion of a panel, thereby enhancing light transmissivity.

Although certain exemplary embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. A display apparatus comprising:
    a substrate comprising a first area and a second area;
    a first pixel electrode in the first area and a second pixel electrode in the second area;
    a first intermediate layer disposed on the first pixel electrode and a second intermediate layer disposed on the second pixel electrode;
    a first opposite electrode facing the first pixel electrode with the first intermediate layer therebetween and having a first light transmissivity; and
    a second opposite electrode facing the second pixel electrode with the second intermediate layer therebetween and having a second light transmissivity lower than the first light transmissivity,
    wherein:
    the second opposite electrode is disposed only in the second area; and
    the first opposite electrode is disposed on the first area and the second area and is in contact with at least a portion of the second opposite electrode.

2. The display apparatus of claim 1, wherein the first opposite electrode comprises a transmissive conductive material.

3. The display apparatus of claim 2, wherein the transmissive conductive material comprises at least one material selected from the group consisting of indium tin oxide, indium zinc oxide, zinc oxide, indium oxide, indium gallium oxide, and aluminum zinc oxide.

4. The display apparatus of claim 1, wherein the second opposite electrode comprises a reflective conductive material.

5. The display apparatus of claim 1, wherein
    the first pixel electrode comprises a transmissive conductive material, and
    light transmissivity of the first pixel electrode is greater than light transmissivity of the second pixel electrode.

6. The display apparatus of claim 1, wherein at least a portion of the first opposite electrode is disposed on the second opposite electrode.

7. The display apparatus of claim 1, further comprising a light transmission window in the first area.

8. A display apparatus comprising:
 a substrate comprising a first area and a second area;
 a first pixel electrode in the first area and a second pixel electrode in the second area;
 a first intermediate layer disposed on the first pixel electrode and a second intermediate layer disposed on the second pixel electrode;
 a first opposite electrode facing the first pixel electrode with the first intermediate layer therebetween and having a first light transmissivity;
 a second opposite electrode facing the second pixel electrode with the second intermediate layer therebetween and having a second light transmissivity lower than the first light transmissivity; and
 a third opposite electrode disposed between the first intermediate layer and the first opposite electrode and between the second intermediate layer and the second opposite electrode.

9. The display apparatus of claim 8, wherein the third opposite electrode comprises a material the same as the material of the first opposite electrode.

10. The display apparatus of claim 8, wherein the first opposite electrode and the second opposite electrode are directly disposed on the third opposite electrode.

11. A display apparatus comprising:
 a substrate comprising a first area and a second area;
 a first pixel electrode in the first area and a second pixel electrode in the second area;
 a first intermediate layer disposed on the first pixel electrode and a second intermediate layer disposed on the second pixel electrode;
 a first opposite electrode facing the first pixel electrode with the first intermediate layer therebetween and having a first light transmissivity;
 a second opposite electrode facing the second pixel electrode with the second intermediate layer therebetween and having a second light transmissivity lower than the first light transmissivity; and
 a liquid-repelling layer disposed between the first intermediate layer and the first opposite electrode.

12. The display apparatus of claim 11, wherein the liquid-repelling layer comprises a liquid-repelling material having a surface energy of no more than about 20 $mJ/m^2$.

13. The display apparatus of claim 12, wherein the liquid-repelling material comprises at least one of a fluoro material, a perfluoro material, and a self-assembled monolayer.

* * * * *